US 6,689,644 B2

(12) United States Patent
Johnson

(10) Patent No.: US 6,689,644 B2
(45) Date of Patent: Feb. 10, 2004

(54) VERTICALLY-STACKED, FIELD-PROGRAMMABLE, NONVOLATILE MEMORY AND METHOD OF FABRICATION

(75) Inventor: Mark G. Johnson, Los Altos, CA (US)

(73) Assignee: Matrix Semiconductor, Inc., Santa Clara, CA (US)

(*) Notice: Subject to any disclaimer, the term of this patent is extended or adjusted under 35 U.S.C. 154(b) by 0 days.

(21) Appl. No.: 10/128,188

(22) Filed: Apr. 22, 2002

(65) Prior Publication Data
US 2003/0064572 A1 Apr. 3, 2003

Related U.S. Application Data

(62) Division of application No. 09/928,536, filed on Aug. 13, 2001.

(51) Int. Cl.[7] .................................. H01L 21/82
(52) U.S. Cl. .............................. 438/131; 438/600
(58) Field of Search ......................... 438/128–132, 438/197, 210, 600–601

(56) References Cited

U.S. PATENT DOCUMENTS

| | | |
|---|---|---|
| 3,414,892 A | 12/1968 | McCormack et al. |
| 3,432,827 A | 3/1969 | Sarno |
| 3,576,549 A | 4/1971 | Hess et al. |
| 3,582,908 A | 6/1971 | Koo |
| 3,634,929 A | 1/1972 | Yoshida et al. |
| 3,671,948 A | 6/1972 | Cassen et al. |
| 3,717,852 A | 2/1973 | Abbas et al. |
| 3,728,695 A | 4/1973 | Frohman-Bentchkowsky et al. |
| 3,787,822 A | 1/1974 | Rioult |
| 3,990,098 A | 11/1976 | Mastrangelo |
| 4,146,902 A | 3/1979 | Tanimoto et al. |
| 4,203,123 A | 5/1980 | Shanks |
| 4,203,158 A | 5/1980 | Frohman-Bentchkowsky et al. |

(List continued on next page.)

FOREIGN PATENT DOCUMENTS

| | | |
|---|---|---|
| EP | 0 073 486 A2 | 3/1983 |
| EP | 0 387 834 A2 | 9/1990 |
| EP | 0 395 886 A2 | 11/1990 |
| EP | 0 516 866 A1 | 12/1992 |
| EP | 0 606 653 A1 | 7/1994 |
| EP | 0 644 548 A2 | 3/1995 |
| EP | 0 800 137 A1 | 10/1997 |
| JP | 60-22352 A | 2/1985 |
| JP | 61222216 A | 10/1986 |
| JP | 63-52463 A | 3/1988 |
| WO | WO 94/26083 | 11/1994 |

OTHER PUBLICATIONS

Akasaka, Yoichi, "Three–Dimensional Integrated Circuit: Technology and Application Prospect," Microelectronics Journal, vol. 20 No. 1–2, 1989, pp. 105–111.

Akasaka, Yoichi, "Three–Dimensional IC Trends," Proceedings of the IEEE, vol. 74, No. 12, Dec. 1986, pp. 1703–1714.

Bertin, Claude L., "Evaluation of a Three–Dimensional Memory Cube System," IEEE Transactions on Components, Hybrids, and Manufacturing Technology, vol. 16, No. 8, Dec. 1993, 1006–1011.

Camperi–Ginestet, C., "Vertical Electrical Interconnection of Compound Semiconductor Thin–Film Devices to Underlying Silicon Circuitry," IEEE Photonics Technology Letters, vol. 4, No. 9, Sep. 1992, pp. 1003–1006.

(List continued on next page.)

Primary Examiner—David Nelms
Assistant Examiner—David Vu
(74) Attorney, Agent, or Firm—Brinks Hofer Gilson & Lione

(57) ABSTRACT

A three-dimensional, field-programmable, non-volatile memory includes multiple layers of first and second crossing conductors. Pillars are self-aligned at the intersection of adjacent first and second crossing conductors, and each pillar includes at least an anti-fuse layer. The pillars form memory cells with the adjacent conductors, and each memory cell includes first and second diode components separated by the anti-fuse layer. The diode components form a diode only after the anti-fuse layer is disrupted.

20 Claims, 12 Drawing Sheets

U.S. PATENT DOCUMENTS

| | | |
|---|---|---|
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye et al. |
| 4,646,266 A | 2/1987 | Ovshinsky et al. |
| 4,672,577 A | 6/1987 | Hirose et al. |
| 4,677,742 A | 7/1987 | Johnson |
| 4,710,798 A | 12/1987 | Marcantonio |
| 4,811,082 A | 3/1989 | Jacobs et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,384 A | 12/1991 | McCollum et al. |
| 5,089,862 A | 2/1992 | Warner, Jr. et al. |
| 5,160,987 A | 11/1992 | Pricer et al. |
| 5,191,405 A | 3/1993 | Tomita et al. |
| 5,202,754 A | 4/1993 | Bertin et al. |
| 5,266,912 A | 11/1993 | Kledzik |
| 5,283,468 A | 2/1994 | Kondo et al. |
| 5,306,935 A | 4/1994 | Esquivel et al. |
| 5,311,039 A | 5/1994 | Kimura et al. |
| 5,334,880 A | 8/1994 | Abadeer et al. |
| 5,391,518 A | 2/1995 | Bhushan |
| 5,398,200 A | 3/1995 | Mazure et al. |
| 5,422,435 A | 6/1995 | Takiar et al. |
| 5,426,566 A | 6/1995 | Beilstein, Jr. et al. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira et al. |
| 5,455,445 A | 10/1995 | Kurtz et al. |
| 5,463,244 A | 10/1995 | De Araujo et al. |
| 5,468,997 A | 11/1995 | Imai et al. |
| 5,471,090 A | 11/1995 | Deutsch et al. |
| 5,481,133 A | 1/1996 | Hsu |
| 5,495,398 A | 2/1996 | Takiar et al. |
| 5,502,289 A | 3/1996 | Takiar et al. |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,552,963 A | 9/1996 | Burns |
| 5,561,622 A | 10/1996 | Bertin et al. |
| 5,581,498 A | 12/1996 | Ludwig et al. |
| 5,585,675 A | 12/1996 | Knopf |
| 5,612,570 A | 3/1997 | Eide et al. |
| 5,654,220 A | 8/1997 | Leedy |
| 5,675,547 A | 10/1997 | Koga |
| 5,686,341 A | 11/1997 | Roesner |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,745,407 A | 4/1998 | Levy et al. |
| 5,751,012 A | 5/1998 | Wolstenholme et al. |
| 5,776,810 A | 7/1998 | Guterman et al. |
| 5,780,925 A | 7/1998 | Cipolla et al. |
| 5,781,031 A | 7/1998 | Bertin et al. |
| 5,801,437 A | 9/1998 | Burns |
| 5,835,396 A * | 11/1998 | Zhang .................... 365/51 |
| 5,883,409 A | 3/1999 | Guterman et al. |
| 5,915,167 A | 6/1999 | Leedy |
| 5,969,380 A | 10/1999 | Seyyedy |
| 5,970,372 A * | 10/1999 | Hart et al. ............... 438/600 |
| 5,976,953 A | 11/1999 | Zavracky et al. |
| 5,985,693 A | 11/1999 | Leedy |
| 6,034,882 A | 3/2000 | Johnson et al. |
| 6,057,598 A | 5/2000 | Payne et al. |
| 6,072,234 A | 6/2000 | Camien et al. |
| 6,087,722 A | 7/2000 | Lee et al. |
| 6,133,640 A | 10/2000 | Leedy |
| 6,185,122 B1 | 2/2001 | Johnson et al. |
| 6,197,641 B1 | 3/2001 | Hergenrother et al. |
| 6,208,545 B1 | 3/2001 | Leedy |
| 6,281,042 B1 | 8/2001 | Ahn et al. |
| 6,291,858 B1 | 9/2001 | Ma et al. |
| 6,307,257 B1 | 10/2001 | Huang et al. |
| 6,314,013 B1 | 11/2001 | Ahn et al. |
| 6,322,903 B1 | 11/2001 | Siniaguine et al. |
| 6,337,521 B1 | 1/2002 | Masuda |
| 6,351,028 B1 | 2/2002 | Akram |
| 6,351,406 B1 | 2/2002 | Johnson et al. |
| 6,353,265 B1 | 3/2002 | Michii |
| 6,355,501 B1 | 3/2002 | Fung et al. |
| 6,420,215 B1 | 7/2002 | Knall et al. |
| 2001/0033030 A1 | 10/2001 | Leedy |
| 2001/0054759 A1 | 12/2001 | Nishiura |
| 2002/0024146 A1 | 2/2002 | Furusawa |
| 2002/0027275 A1 | 3/2002 | Fujimoto et al. |
| 2002/0030262 A1 | 3/2002 | Akram |
| 2002/0030263 A1 | 3/2002 | Akram |

OTHER PUBLICATIONS

Douglas, John H., "*The Route to 3–D Chips,*" High Technology, Sep. 1983, pp. 55–59.

Frohman–Bentchkowsky, Dov, "*A Fully Decoded 2048–Bit Electrically Programmable FAMOS Read–Only Memory,*" IEEE Journal of Solid–State Circuits, vol. SC–6, No. 5, Oct. 1971, pp. 301–306.

Hayashi, Y., "*A New Three Dimensional IC Fabrication Technology, Stacking Thin Film Dual–CMOS Layers,*" IEDM 1991, pp. 657–660.

Hayasky, Fumihiko, "*A Self–Aligned Split–Gate Flash EEPROM Cell with 3–D Pillar Structure*" 1999 Symposium on VLSI Technology Digest of Technical Papers, pp. 87–88.

"3–D Chip–on–Chip Stacking," Industry News, Semiconductor International, Dec. 1991.

Inoue, Y., "*A Three–Dimensional Static RAM,*" IEEE Electron Device Letters, vol. Edl.–7, No. 5, May 1986, pp. 327–329.

Jokerst, N.M., "*Manufacturable Multi–Material Integration Compound Semiconductor,*" SPIE—The International Society for Optical Engineering, vol. 2524, Jul. 11–12, 1995, pp. 152–163.

Kurokawa,Takakazu, "*3–D VLSI Technology in Japan and an Example: A Syndrome Decoder for Double Error Correction,*" Future Generations Computer Systems 4, No. 2, Sep. 1988, pp. 145–155.

Lay, Richard W., "*TRW Develops Wireless Multiboard Interconnect System,*" Electronic Engineering Times, Nov. 5, 1984.

Maliniak, David, "*Memory–Chip Stacks Send Density Skyward,*" Electronic Design 42, No. 17, Aug. 22, 1994, pp. 69–75.

Pein Howard, et al., "*Performance of the 3–D PENCIL Flash EPROM Cell and Memory Array,*" IEEE Transactions on Electron Devices, vol. 42, No. 11, Nov. 1995, pp. 1982–1991.

Reber, M., et al., "*Benefits of Vertically Stacked Integrated Circuits for Sequential Logic,*" IEEE 1996, pp. 121–124.

Sakamoto, Koji, "*Architecture of Three Dimensional Devices,*" Bulletin of The Electrotechnical Laboratory, vol. 51, No. 1, 1987, pp. 16–29.

Sato, Noriaki, et al., "*A New Programmable Cell Utilizing Insulator Breakdown,*" IEAM Technical Digest, 1985, pp. 639–642.

Schlaeppi, H.P., "*Microsecond Core Memories Using Multiple Coincidence,*" 1960 International Solid–State Circuits Conference, Digest of Technical Papers, Feb. 11, 1960, pp. 54–55.

Schlaeppi, H.P., "*Microsecond Core Memories Using Multiple Coincidence,*" IRE Transactions on Electronic Computers, Jun. 1960, pp. 192–198.

Stacked Memory Modules, IBM Technical Disclosure Bulletin, May 1995, pp. 433–434.

Stern, Jon M., "*Design and Evaluation of an Epoxy Three–Dimensional Multichip Module,*" IEEE Transactions on Components, Packaging, and Manufacturing Technology—Part B, vol. 19, No. 1, Feb. 1996, pp. 188–194.

Terrill, Rob, "*3D Packaging Technology Overview and Mass Memory Applications,*" IEEE 1996, pp. 347–355.

Thakur, Shashidhar, "*An Optimal Layer Assignment Algorithm for Minimizing Crosstalk for Three Layer VHV Channel Routing,*" IEEE 1995, pp. 207–210.

Watanabe, H., "*Stacked Capacitor Cells for High–Density Dynamic RAMs,*" IEDM 1988, pp. 600–603.

Yamazaki, K., "*Fabrication Technologies For Dual 4–KBIT stacked SRAM,*" IEDM 1986, pp. 435–438.

"Multilayered Josephson Junction Logic and Memory Devices," Lomatch, S: Rippert, E.D.; Ketterson, J.B., Proceedings of the SPIE–The International Society for Optical Engineering vol. 2157 p. 332–43.

"Advanced Cell Structures for Dynamic RAMs," Lu, N.C.C.: IEEE Circuits and Devices Magazine, vol. 5 No. 1 p. 27–36 Jan. 1989.

"Architecture of Three Dimensional Devices," Sakamoto, K.: Journal: Bulletin of the Electrotechnical Laboratory vol. 51, No. 1 P. 16–29 1987.

"Wide Application of Low–Cost Associative Processing Seen," Electronic Engineering Times, p 43, Aug. 26, 1996.

"Interconnects & Packaging," Electronic Engineering Times, p43, Jun. 24, 1996.

"Closing in on Gigabit DRAMs," Electronic Engineering Times, p035, Nov. 27, 1995.

"Module Pact Pairs Cubic Memory with Vision Tek," Semiconductor Industry & Business Survey, v17, n15, pN/A Oct. 23, 1995.

"Layers of BST Materials Push Toward 1Gbit DRAM," Electronics Times, p 10, Oct. 19, 1995.

"Technologies Will Pursue Higher DRAM Densities," Electronic News (1991), p 12 Dec. 5, 1994.

"Looking for Diverse Storage," Electronic Engineering Times, p 44 Oct. 31, 1994.

"Special Report: Memory Market Startups Cubic Memory: 3D Space Savers," Semiconductor Industry & Business Survey, v16, n13, pN/A Sep. 12, 1994.

"Technique Boosts 3D Memory Density," Electronic Engineering Times p 16 Aug. 29, 1994.

"Memory Packs Poised for 3D Use," Electronic Engineering Times p 82 Dec. 7, 1992.

"MCMs Hit the Road," Electronic Engineering Times p 45 Jun. 5, 1992.

"IEDM Ponders the "Gigachip" Era," Electronic Engineering Times , p 33 Jan. 20 , 1992.

"Tech Watch: 1–Gbit DRAM in Sight," Electronic World News, P 20 Dec. 16, 1991.

"MCMs Meld into Systems," Electronic Engineering Times p 35 Jul 22, 1991.

"Systems EEs see Future in 3D," Electronic Engineering Times p 37 Sep. 24, 1990.

U.S. patent application Ser. No. 09/560,626, "Three–Dimensional Memory Array and Method of Fabrication," filed on Apr. 28, 2000, inventor: N. Johan Knall.

* cited by examiner

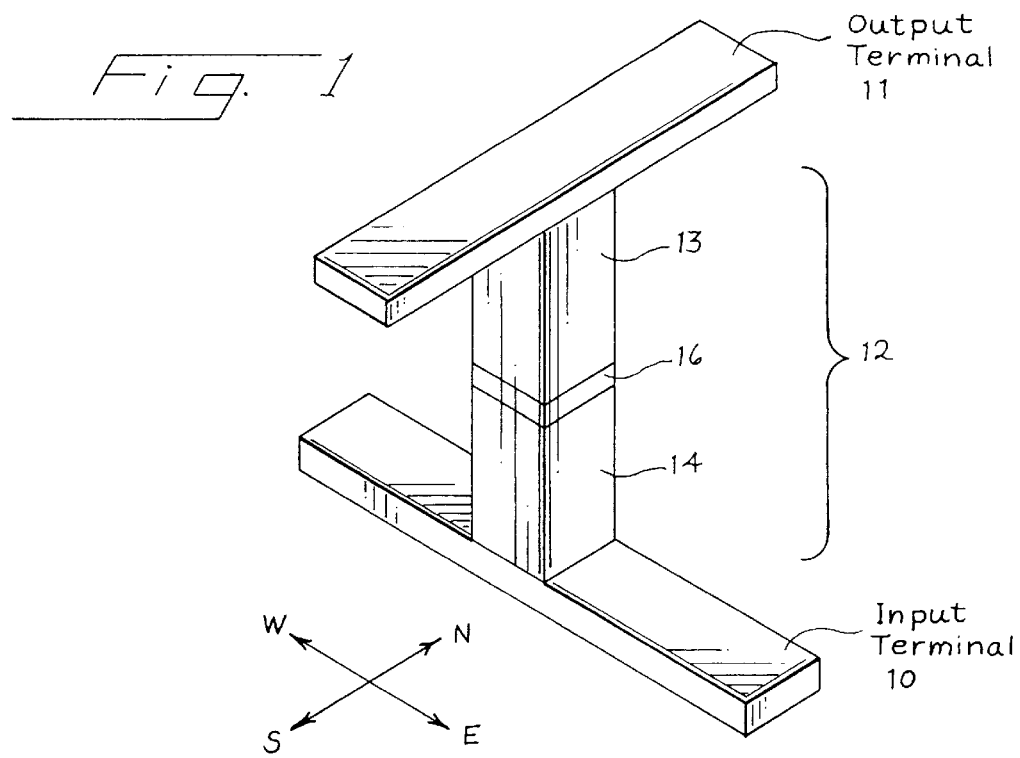
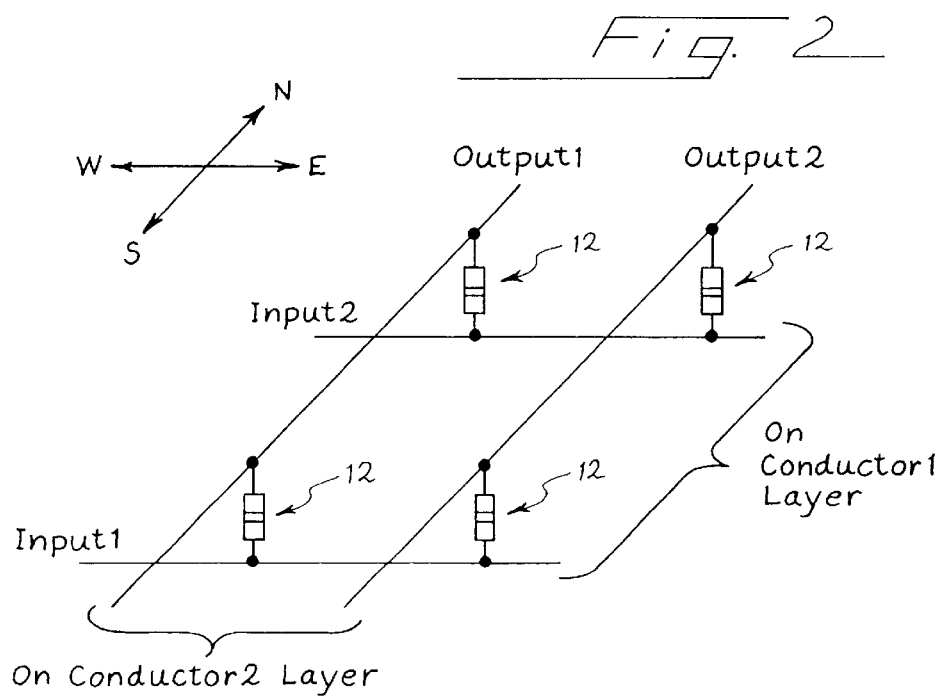

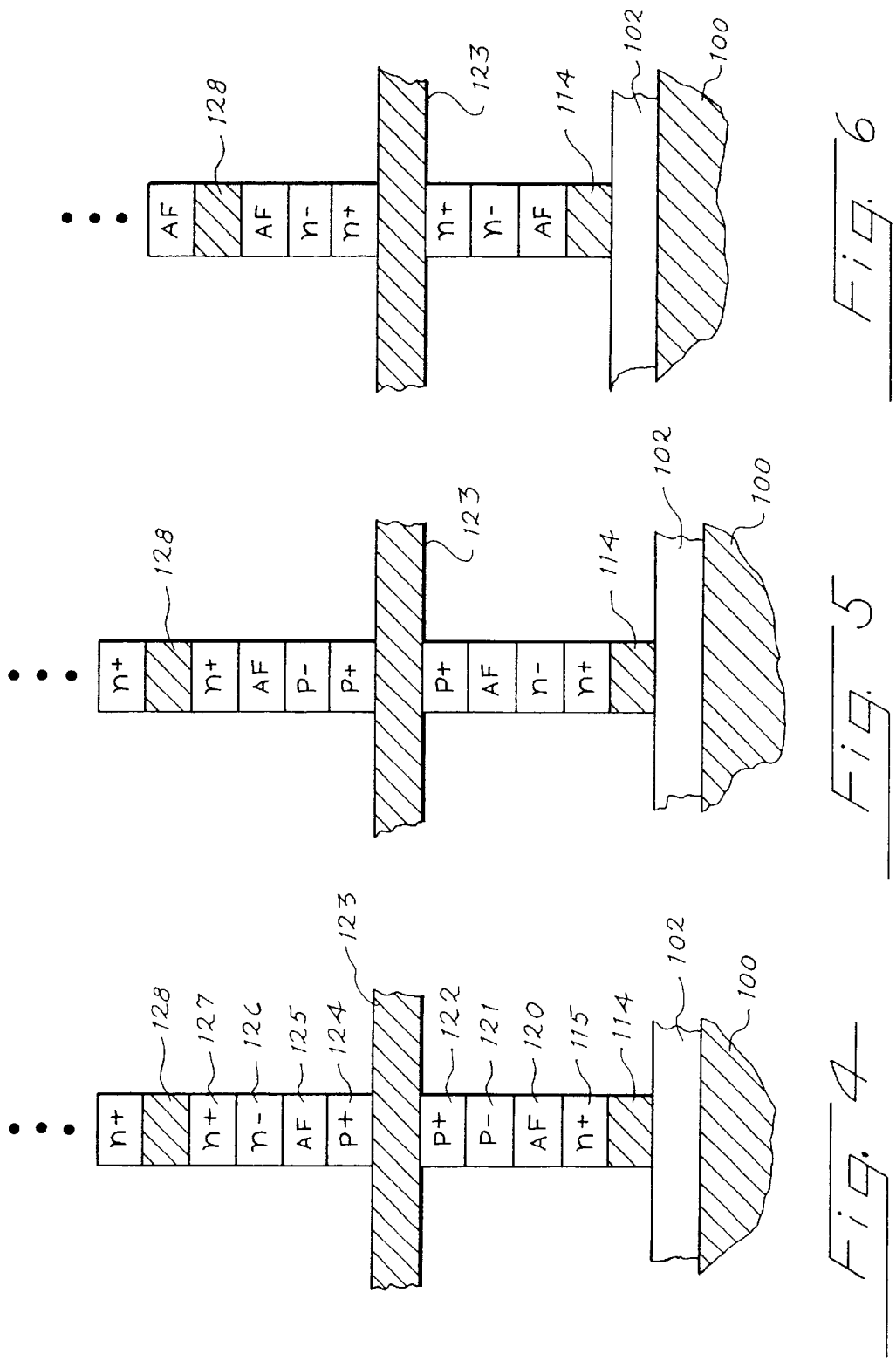

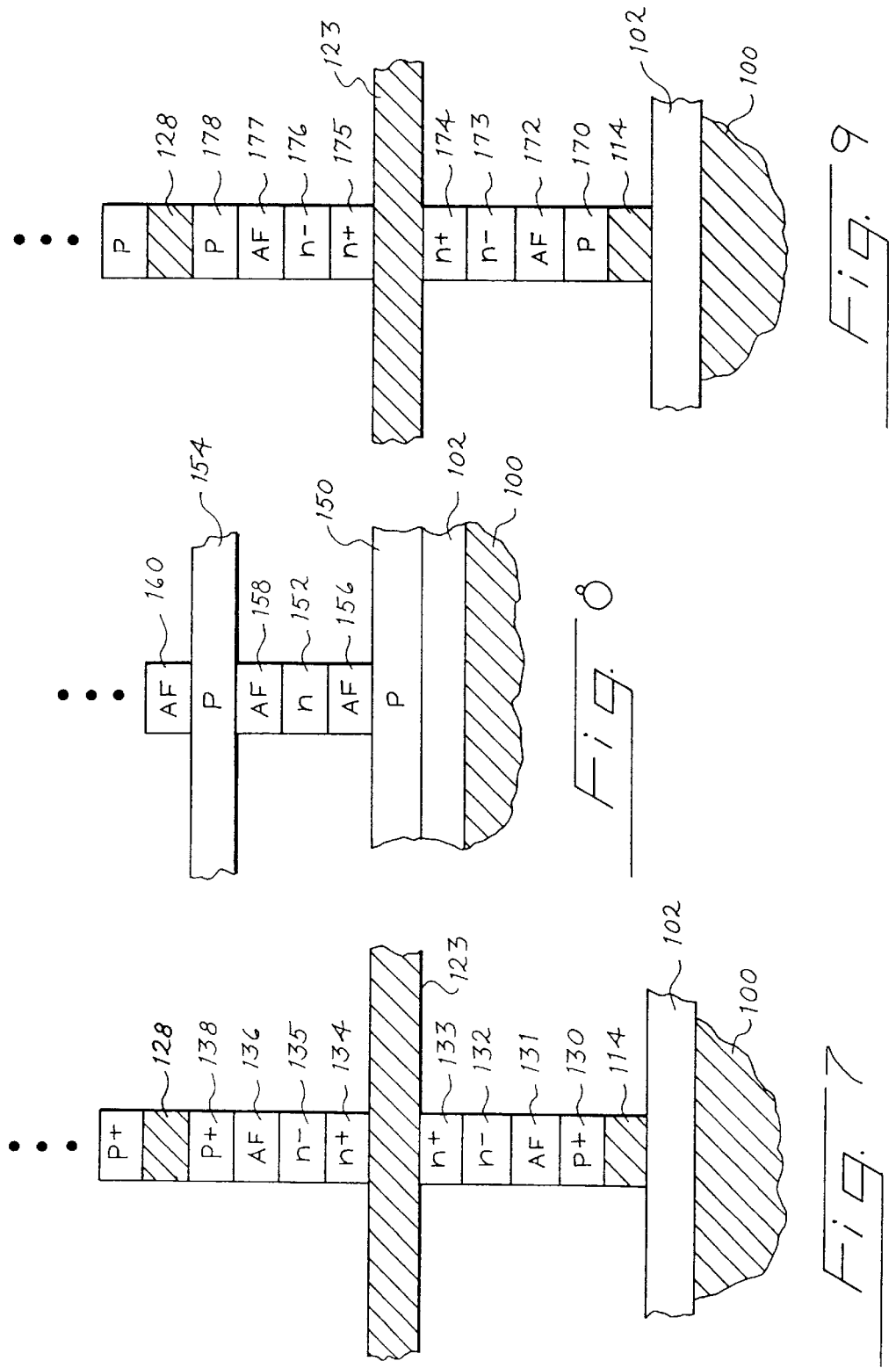

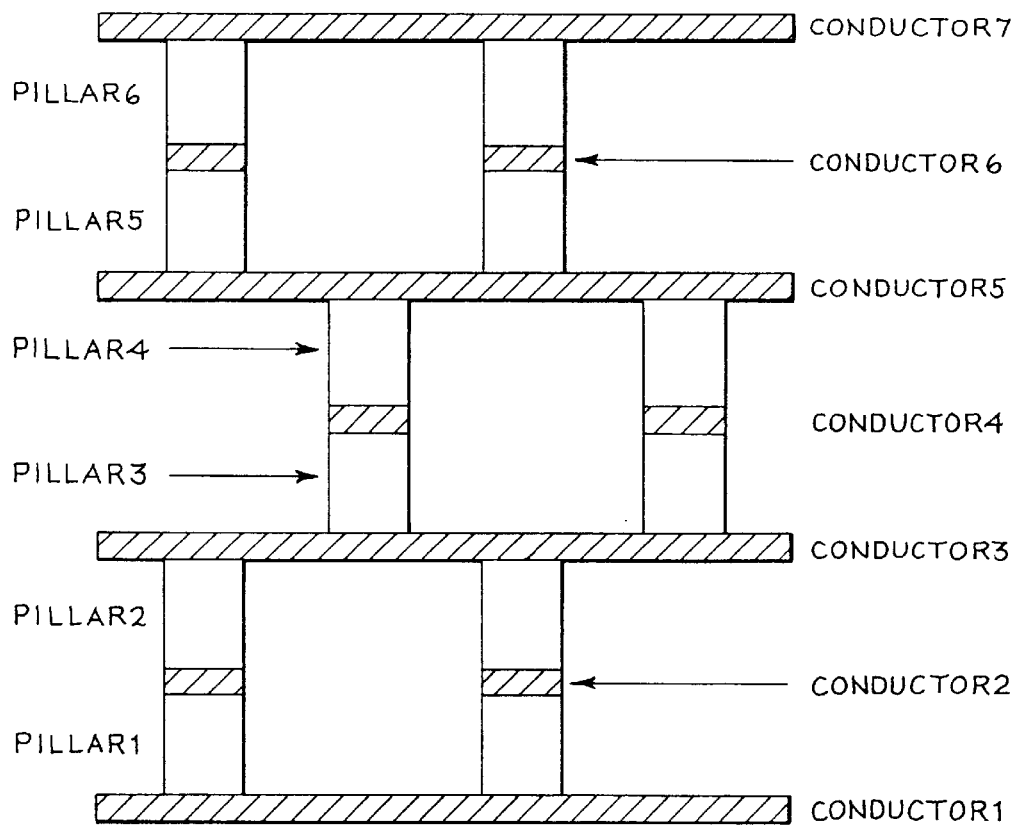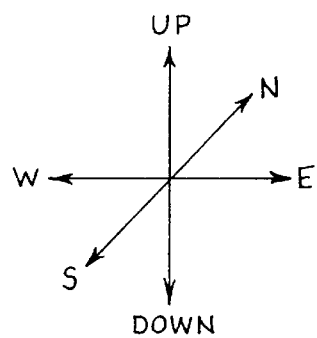
Fig. 11

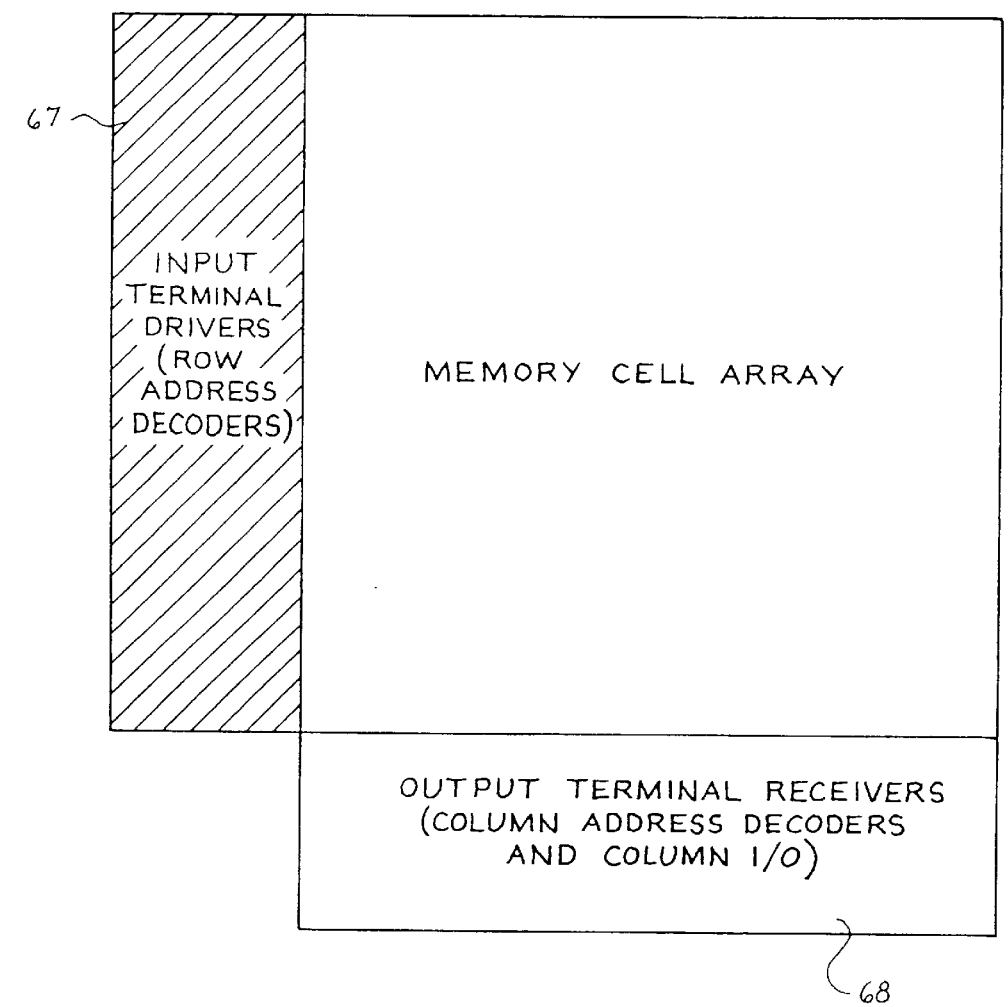
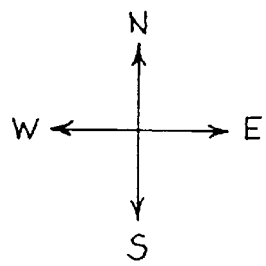
Fig. 14

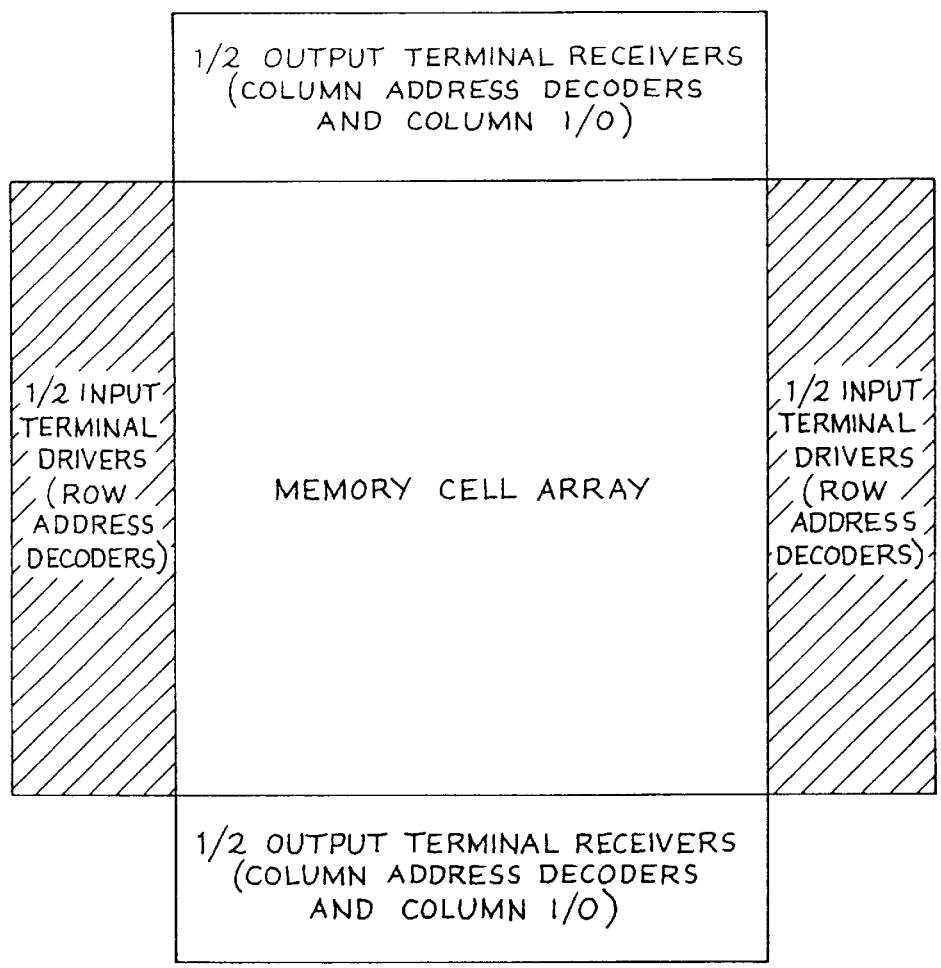
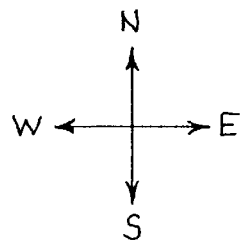
Fig. 15

US 6,689,644 B2

VERTICALLY-STACKED, FIELD-PROGRAMMABLE, NONVOLATILE MEMORY AND METHOD OF FABRICATION

This is a division of application Ser. No. 09/928,536 filed Aug. 13, 2001.

BACKGROUND 3D memories can be much lower cost than conventional 2D memories. If a conventional memory occupies A square millimeters of silicon area, then a 3D memory comprising N planes of bits occupies approximately (A/N) square millimeters of silicon area. Reduced area means that more finished memory devices can be built on a single wafer, thereby reducing cost. Thus there is a strong incentive to pursue 3D memories having many planes of memory cells.

Johnson U.S. Pat. No. 6,034,882, assigned to the assignee of the present invention and hereby incorporated by reference in its entirety, describes a 3-dimensional, field-programmable, non-volatile memory that is well suited to extremely small memory cells. Each memory cell includes a self-aligning pillar of layers formed at the intersection between upper and lower conductors. In one embodiment, each memory cell includes a steering element such as a diode that is connected in series with a state change element such as an anti-fuse layer. Each pillar is isolated from neighboring pillars by a pair of self-aligned etch steps and subsequent dielectric depositions. When the anti-fuse layer is intact (the cell is not programmed), the cell is electrically an open circuit. When the anti-fuse layer is breached (the cell is programmed), the cell is electrically a diode in series with the resistance of the breached anti-fuse layer. Unfortunately, the area and perimeter of this diode are the full area and full perimeter of the pillar, and so this diode's leakage is relatively high.

Knall U.S. patent application Ser. No. 09/560,626 discloses a memory cell with low leakage. The disclosed memory cell places an anti-fuse layer between the anode and the cathode of the diode. When the anti-fuse layer is intact, the cell is electrically an open circuit. But when the anti-fuse is breached, the anode material and cathode material are brought together in a small-diameter filament, and a diode is formed. The small filament gives the so-formed diode a very small area and a very small perimeter. Thus the diode's leakage is relatively low. This is advantageous in the construction of a memory, since diode leakage makes sensing (for read operations) difficult, and since diode leakage current increases power consumption.

Knall's embodiments use a "rail stack" configuration, in which the anode material and the cathode material are continuous stripes extending in orthogonal directions. These embodiments are fabricated with the following steps: deposit the rail stack materials, etch them into stripes, dielectric fill between them, and polish back to expose the top of the rail stack. Then the thin anti-fuse dielectric is deposited or grown. As will be appreciated by those skilled in the art, it is more difficult to form a high-quality, thin dielectric film if that film is to be created on a polished surface. The polish operation (conventionally carried out using a CMP, Chemical Mechanical Polish, process) creates defects and leaves particles of slurry behind. This makes it harder to create a high quality film.

A need presently exists for an improved memory that is characterized by small cell size, ease of manufacture, and low leakage.

SUMMARY

By way of general introduction, the preferred embodiments described below include an array of pillars that are self-aligned at the intersection of first and second crossing conductors. The pillars form memory cells with the adjacent conductors, and each memory cell includes first and second diode components separated by an anti-fuse layer. The diode components form a diode only after the anti-fuse layer is disrupted.

This section has been provided by way of general introduction, and it is not intended to narrow the scope of the following claims.

BRIEF DESCRIPTION OF THE DRAWINGS

FIG. 1 is a perspective view of one embodiment of a memory cell built in accordance with the present invention.

FIG. 2 is a schematic of an array using the cell of FIG. 1.

FIGS. 4–9 are schematic views of six alternative pillar arrangements that can be used in the embodiment of FIG. 1.

FIG. 10($b$) illustrates the structure of FIG. 10($a$) after patterning.

FIG. 10($c$) illustrates the structure of FIG. 10($b$) after an additional conductor layer and layer stack have been formed.

FIG. 10($d$) illustrates the structure of FIG. 10($c$) after patterning.

FIG. 10($e$) illustrates the structure of FIG. 10($d$) after an additional conductor layer and layer stack have been formed.

FIG. 10($f$) illustrates the structure of FIG. 10($e$) after another patterning step.

FIG. 11 is a cross-sectional elevation view of an array using the cell of FIG. 1 where the cells are staggered in the vertical direction.

FIG. 14 is a plan view of a substrate showing a layout of circuitry in the substrate.

FIG. 15 is a plan view of a substrate showing another layout of circuitry in the substrate.

DETAILED DESCRIPTION OF THE DRAWINGS

Figure 3:
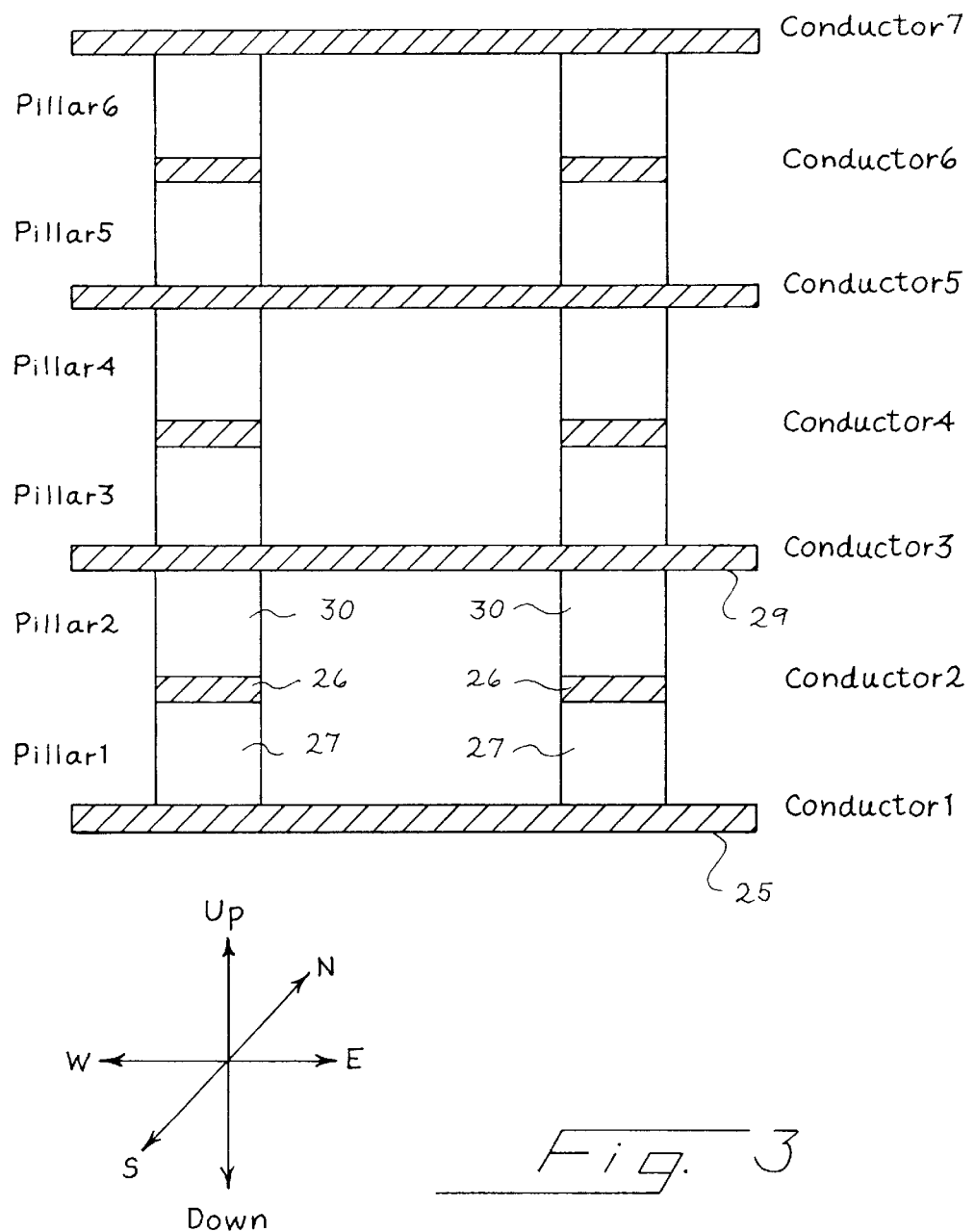
FIG. 3 is a cross-sectional elevation view of an array using the cell of FIG. 1.

Field-programmable, non-volatile memory cells and memory arrays are disclosed. In the following description numerous specific details are set forth in order to provide a thorough understanding of the illustrated embodiments. However, it will be apparent to one skilled in the art that the present invention may be practiced without these specific details. In other instances, well-known circuits and processes have not been described in detail in order not to obscure the description. The drawings are not drawn to scale.

Overview

The field-programmable, non-volatile memory cell described below is built above, rather than in, a planar substrate. Therefore, this memory cell can be stacked vertically in numerous layers to form a three-dimensional array. Each layer of memory cells interacts only with the layer above and the layer below, which makes vertical stacking of layers quite simple.

A unique organization of these cells in a three-dimensional memory array disposed above a substrate, with peripheral circuitry built in the substrate, is also described.

FIG. 1 shows one embodiment of our memory cell. It has two explicit terminals: an input terminal 10 and an output terminal 11. Between these terminals, the memory cell contains a pillar 12 of layers. Neither the input terminal 10, nor the output terminal 11, nor the pillar 12 of layers is built in the planar substrate.

The pillar 12 of layers includes first and second diode components 13, 14 separated by an anti-fuse layer 16. The anti-fuse layer 16 is initially insulating, and in this state no diode is formed. When the anti-fuse layer 16 is disrupted, at least part of the diode component 13 contacts the diode component 14, thereby forming a diode.

Once formed, the diode is a device with a strongly asymmetric current-versus-voltage characteristic: it conducts current more readily in one direction than in the other. The purpose of the diode is to ensure that current flow through the memory cell is substantially unidirectional. This unidirectional behavior enables the memory decoders to establish a unique circuit path to each individual memory cell, allowing it to be individually accessed (for reads and for writes) regardless of the state of all other cells.

The anti-fuse layer 16 can be placed in more than one state, and its state is not lost or altered when electrical power is removed. One possible implementation, among the many discussed below, is a dielectric-rupture anti-fuse having the states {high impedance} and {low impedance}. These two stored states accomplish the encoding of one bit of memory.

As shown in FIG. 1, the pillar 12 has a generally rectangular cross-section. The pillar is vertical and so is the current flow. Depending on the orientation of the diode, current can flow either upwards or downwards after the anti-fuse layer 16 is breached. In fact, in one embodiment, current flows upwards in some layers of a vertical stack of cells, and downwards in the other layers.

The anti-fuse layer 16 is chosen so that it can be switched from its initial state to another state by electrical means, thereby making the memory field programmable. For example, the state of a dielectric-rupture anti-fuse may be changed electrically by applying a relatively large voltage (when compared to the voltage used for reading) across the input and output terminals of the memory cell.

The memory cell of FIG. 1 can be fabricated with full self-alignment in both the X (east-west) and Y (north-south) directions. This means the pillars are defined by, and are automatically formed by, the intersection of an input conductor and an output conductor. Thus the cell can be made quite small, since its feature sizes need not include often-used allowances for misalignment tolerances.

Furthermore, the number of photolithographic masking steps needed to build the cell of FIG. 1 is small. For a single level of cells as shown in FIGS. 1 and 2, three masking steps are needed: one to pattern the bottom conductor and cell material, another to pattern the upper conductor and cell material, and a third to provide contact holes outside the array for vertical electrical connections. This patterning scheme results in a self-alignment of the cell pillar 12 to the upper and lower conductors. If a second level of cells is added vertically above the first level, only two additional photolithographic steps are needed: one for the next level conductor and the cell material, and the second for the contacts outside the array. The top conductor of the lower level of cells forms the bottom conductor of the top layer of cells. In general, if the array contains (N) levels of cells, there are (N+1) conductor layers and (N+1) photomasking steps in the fabrication of the cell array itself. There are also a number of additional photomasking steps to form contacts. These contacts are outside the cell array; they make connection between the array conductor layers and the peripheral circuits.

The memory cell may also be fabricated using alternative embodiments; the self-aligned pillar formation described above may be replaced by a formation involving the use of a pillar formation photomask. This eliminates the self-alignment of the pillar to the conductors, but is advantageous in fabrication processes that potentially exploit the physics of free sidewalls. These processes include diode component formation using solid-phase crystallization of amorphous silicon, laser crystallization of amorphous or polycrystalline silicon, and other processes apparent to persons skilled in the art. The contact to the upper conductor layer in both the self-aligned fabrication process and the non-self-aligned fabrication process described above is exposed by the planarization of the insulation, requiring no photomask step. This process may be replaced by a contact formation photomasking step, as would be apparent to persons skilled in the art.

Assume the first conductor 25 of FIG. 3 runs east-to-west. Then the second conductor 26 will run north-to-south (orthogonally), and memory cell pillars 27 will be formed wherever a vertical projection of the first conductor intersects the second conductor. The third-conductor 29 will run east-to-west, and memory cell pillars 30 will be formed wherever the third conductor 29 intersects the second conductor 26. Similarly, the fourth, sixth, eighth, tenth, . . . conductors will run north-south, and the fifth, seventh, ninth, eleventh, . . . conductors will run east-west. Odd-numbered conductors run in one direction, and even-numbered conductors run in the perpendicular direction. Thus, conductor number J forms pillars downward (to wiring layer number J−1) and it forms pillars upward (to wiring layer number J+1).

Since the memory cells need not contact a substrate, a substrate beneath the memory cell array is available for use other than for defining the memory cells. In one embodiment of the present invention, this area may be used to good advantage by laying out substantial portions of the row decoders, column decoders, I/O multiplexers, and read/write circuits directly beneath the memory cell array. This helps to minimize the fraction of the die surface area not devoted to memory cells, which increases the figure of merit known as "array efficiency":

$$\text{Array Efficiency} = \frac{\text{(Total area devoted to memcells)}}{\text{(Total area devoted to memcells)} + \text{(Total area devoted to non memcells)}}$$

As can be seen, a decrease in (total area devoted to non-memcells) results in an increased array efficiency.

Memory Cell: Pillar

In the embodiment of the memory cell shown in FIG. 1, there are two explicit local terminals: an input terminal 10 (also called a wordline), and an output terminal 11 (also called a bitline). In addition the cell may also contain "implicit" or "widely shared" terminals which are unavoidable consequences of its construction, and which are common to large groups of cells at once. One example of an implicit terminal is the substrate, which forms a parasitic capacitance to each memory cell. To simplify the figures and the discussion, these implicit terminals are omitted, but as will be appreciated these implicit terminals might affect the functionality and performance of the memory cell. Thus the memory cell of FIG. 1 is referred to as a "two terminal structure", meaning there are two explicit, local, terminals, possibly with additional terminals that are implicit rather than explicit.

Between its input terminal and output terminal, the memory cell includes a series connection of diode components and an anti-fuse layer. Once formed, the diode is a semiconductor element that has a strongly asymmetric current-versus-voltage characteristic; it conducts current much more readily in one direction than in the other. Some possible implementations of the diode are (i) a PN junction diode, in amorphous, microcrystalline, polycrystalline or single-crystal semiconductor (e.g. Si, Ge, SiGe, GaAs, InP, etc.); (ii) a metal-semiconductor Schottky diode; (iii) a junction field-effect transistor with gate connected to source (or to drain); (iv) a MOSFET with gate either floating, or connected to source or connected to drain; (v) a Zener diode, avalanche diode, or tunnel diode; (vi) a four-layer diode (SCR); (vii) a P-I-N diode in amorphous, microcrystalline, polycrystalline or single-crystal semiconductor; and others that will be readily apparent to those skilled in the art.

For descriptive purposes in this disclosure the two ends of the diode are referred to as "anode" and "cathode", arranged so that conventional current flows more readily from "anode" to "cathode" than from "cathode" to "anode". These labels are consistent with standard terminology for a PN junction diode: conventional current in a PN junction diode flows from anode to cathode. Of course the present invention is not limited to the use of a PN junction diode (as was discussed in the preceding paragraph); the adoption of the same terminal labeling as a diode is merely for convenience and familiarity. Further, if the voltage on the diode's anode is larger than the voltage on its cathode, the diode is "forward biased." But when the cathode voltage exceeds the anode voltage, we will say the diode is "reverse biased." These phrases are taken from standard diode terminology, again for convenience and familiarity.

The diode can be oriented two different ways: (1) with its anode facing the input terminal and its cathode facing the output terminal; (2) with its cathode facing the input terminal and its anode facing the output terminal. Either orientation can be made to function correctly, by appropriate design of the memory decoders and readwrite circuits, and neither orientation is strongly preferred over the other.

Some possible realizations of the anti-fuse layer 16 include, but are not limited to, (a) dielectric-rupture anti-fuses; (b) intrinsic or lightly-doped polycrystalline semiconductor anti-fuses; (c) amorphous semiconductor anti-fuses; and others.

During integrated circuit manufacturing, the anti-fuse layer 16 of the memory cell is fabricated and placed in a certain one of its possible states; this is called the "initial state." For example, if the anti-fuse layer is a dielectric-rupture anti-fuse having the two states (ruptured dielectric) and (intact dielectric), the initial state of this element is (intact) after manufacturing and before programming. Other embodiments of anti-fuse layers will have different sets of states and thus different initial states. By convention this initial state, the "logic zero" state, denotes the initial value stored in the memory cell during semiconductor manufacturing. Of course, other conventions, e.g. calling the initial state "logic one," would be equally valid, and the choice is merely a matter of preference or convenience rather than technological necessity.

The memory cell is programmed by causing the anti-fuse layer 16 to transition from its initial state into a new state. Many embodiments of the anti-fuse layer 16 can be caused to change state by applying a suitably large voltage across the memory cell, from input terminal to output terminal.

For example if the anti-fuse layer 16 is embodied as a dielectric-rupture anti-fuse, it is programmed by applying a large voltage across the cell's terminals (or by forcing a large current through the cell), with the polarity chosen such that the diode is forward biased. This places a large electric field directly across the dielectric anti-fuse, which ruptures the dielectric, thus changing the state of the anti-fuse layer.

One possible method for programming a dielectric-rupture anti-fuse layer is to ground the memory cell's output terminal and simultaneously raise its input terminal to a large positive voltage (assuming the diode is so oriented that its anode faces the input terminal and its cathode faces the output terminal, i.e., diode is forward biased when the input terminal is at a higher voltage than the output terminal). If the diode is oriented the other way, with anode facing the output terminal and cathode facing the input terminal, the designer can simply reverse the programming voltages and keep the diode forward biased during programming: ground the input terminal and simultaneously raise the output terminal to a large positive voltage. Many other voltage arrangements for forward biasing the diode and programming a dielectric-rupture anti-fuse layer will be readily apparent to those skilled in the art.

Other embodiments of the anti-fuse layer can be caused to change state by forcing a suitably large current through the memory cell, rather than by forcing a large voltage across the memory cell. For example, if the anti-fuse layer is embodied as a polysilicon-resistor fuse, it may be programmed by connecting a current source to its input terminal and simultaneously grounding its output terminal (assuming this polarity forward biases the diode). Assuming the current is large enough, it alters the resistance of the polysilicon-resistor fuse, thus changing the state of the anti-fuse layer and programming the cell.

During programming, it is possible for nonselected memory cells to be reverse-biased by the full programming voltage. Accidental writes of nonselected memory cells may occur, if the reverse leakage current of the diode exceeded the programming current necessary to change the state of the anti-fuse layer. Thus, the characteristics of the diode and anti-fuse layer should be matched to one another: an anti-fuse layer that requires a large current to program (e.g., an instrinsic poly fuse) can be used with a rather high-leakage diode, while an anti-fuse layer that programs at very low current (e.g., a dielectric rupture anti-fuse) is preferably combined with a low-leakage diode.

In a first embodiment, if a thin, highly resistive, poly-crystalline silicon film anti-fuse is employed (as taught in U.S. Pat. No. 4,146,902), its programming operation is irreversible and the cell is one-time programmable. After manufacturing and before programming, all cells contain "logic zero". Those cells whose desired contents are "logic one" are programmed, irreversibly, by forcing the anti-fuse into a new state. Logic zeroes may become logic ones (by programming), but logic ones may not become logic zeroes (since programming is irreversible in this type of device).

While the above discussion is based on an anti-fuse layer that has two states, this is not necessary. An anti-fuse that can provide a predetermined range of resistance where for instance it is partly fused, and the anti-fuse would then provide a three-state element.

Memory Cell: Conductors

As shown in FIG. 1, the field-programmable, non-volatile memory cell consists of a vertical pillar, with a conductor at the bottom of the pillar and another conductor at the top.

The bottom conductor is a relatively long conductor line or wire on a first conductor layer. This conductor runs in a certain direction (for example, east-to-west). The top conductor is a relatively long conductor line or wire on a second conductor layer, vertically above the layer that forms the bottom conductors. The top conductors run in another direction (for example, north-to-south). The angle between the top and bottom conductors is preferably ninety degrees (i.e. it is preferred they are orthogonal), but this is not mandatory. The memory cell pillar is located at the intersection where the top conductor crosses over a projection of the bottom conductor.

In practice the conductors on each level are parallel, spaced-apart conductors. For example, the space between each conductor can be equal to the conductors width.

The first conductor layer ("conductors1") contains a large number of parallel conductors all running in the same direction, for example, east-to-west. And the second conductor layer ("conductors2") also contains a large number of parallel conductors all running in the same direction, for example, north-to-south, preferably perpendicular to the conductor direction of the first conductor layer as shown in FIG. 3. Wherever a conductor on conductors2 crosses over (or "intersects") a conductor on conductors1, one of our field programmable non-volatile memory cells is fabricated. This is shown in FIG. 2.

Vertically from bottom to top, the memory cell of FIGS. 1–3 contains a conductor, then a pillar, then another conductor: conductors1→pillar→conductors2. Conductors1 is on the bottom and conductors2 is on the top. But then conductors2 is the bottom of a new level of memory cells, vertically stacked above the first level: conductors1→pillar1→conductors2→pillar2→conductors3. The array of FIGS. 1–3 stacks multiple levels of memory cells above one another: a vertical stack having (N) levels of memory cells contains (N) levels of pillars and (N+1) layers of conductors. (It takes (N+1) conductor layers to make (N) levels of cells: one conductor on the bottom of each level of pillars, and then one more conductor on the top of the array).

FIG. 3 shows a portion of a three-dimensional memory array according to the present invention, having N=6 levels of memory pillars and (N+1)=7 conductor layers. A vertical stack of (N) pillars uses 1/N as much surface area as an assembly of (N) pillars that are not stacked vertically; vertical stacking gives an N-fold improvement in density.

A memory pillar's bottom conductor is the top conductor of the memory pillar below, and a memory pillar's top conductor is the bottom conductor of the memory pillar above. This makes stacking especially simple and flexible.

In one embodiment, the two conductors at either end of a memory pillar are perpendicular. And since conductors are shared between levels of pillars, the result in this embodiment is that even-numbered conductors run in one direction, and odd-numbered conductors run in the perpendicular direction. For example, suppose conductors1 runs east-to-west. Conductors2 would be perpendicular to conductors1, so conductors2 would run north-to-south. Conductors3 would be perpendicular to conductors2, so conductors3 would run east-to-west. Conductors4 would run north-to-south (perpendicular to conductors3), and so forth. Thus conductors 1, 3, 5, . . . run east-to-west, and conductors 2, 4, 6, . . . run north-to-south (in this example).

Fabrication

In one embodiment of the present invention, a conductor layer (say, conductor layer number J) runs north-to-south, and adjacent conductor layers (numbers J−1 and J+1) run east-to-west. Wherever a conductor's vertical projection on layer (J) crosses over a conductor on layer (J−1), a memory cell pillar is created. Similarly, wherever a conductor's projection on layer (J+1) crosses a conductor on layer (J), a memory cell pillar is created. Memory cell pillars are defined and patterned by the intersection (crossover) of the conductors, and so the pillars are self-aligned to the conductors. Self-alignment is an extremely important advantage, because it lets the photolithographic patterns of the memory cell be designed without including any extra allowance for misalignment tolerances. Thus the pattern features of our self-aligned memory cell may be made smaller, resulting in a smaller cell area, which gives higher density and lower cost.

For purposes of illustrating the self-aligned fabrication of these pillars, consider an embodiment which uses four sequential layers of material (a "layer stack") to fabricate the diode components and the anti-fuse layer. In this illustrative example the diode components make up a polycrystalline silicon PN junction diode, and the anti-fuse layer consists of a poly-oxide-poly dielectric rupture anti-fuse. Other embodiments are set forth in the body of this application.

The pillars described above can take many forms, and FIGS. 4–9 provide six illustrative examples. In each case, the pillars are shown between crossing upper and lower conductors.

In the example of FIG. 4, a memory array is fabricated on a substrate 100 that may be a conventional silicon monocrystalline substrate. Alternately, the substrate 100 may be a Silicon-on-Sapphire substrate, a Dielectrically Isolated substrate, or a Silicon-on-Insulator substrate. As an initial step an insulating layer 102 is formed over the substrate 100. This layer 102 may be planarized with for instance chemical mechanical polishing (CMP) to provide a flat surface on which the array can be fabricated.

Following this, a conductive layer 114 is formed on the insulating layer 102. Many materials are suitable for fabricating conductive layers, including elemental metals such as tungsten, tantalum, aluminum, copper and metal alloys such as MoW. Metal suicides may also be used such as $TiSi_2$ or $CoSi_2$, or a conductive compound such as TiN, WC may be used. A highly doped semiconductor layer such as silicon is also suitable. Multiple layer structures may be used selecting one or more of the above.

Following the deposition of a conductive layer, a layer 115 of semiconductor material such as silicon is formed over the conductive layer. This is typically a polysilicon layer; however, an amorphous layer may be used. Other semiconductor materials may be used such as Ge, GaAs, etc. In the embodiment of FIG. 4 this semiconductor layer is a highly-doped diode component, and forms one-half of a diode.

Following this, in the embodiment of FIG. 4, a material for the anti-fuses used to program the array is deposited (shown as layer 120). In one embodiment, the layer 120 is a dielectric such as silicon dioxide that is deposited by chemical vapor deposition (CVD). Growth of the anti-fuse can be achieved by a number of methods, including hot steam oxidation, dry thermal oxidation, plasma-oxidation, wet-chemical oxidation and electrochemical oxidation. Materials that can be used for the anti-fuse layer, and that can be grown and/or deposited, include; silicon dioxide, silicon nitride, silicon oxynitride, amorphous carbon and other insulating materials or combinations of materials. (Also an undoped layer of silicon may be used for the anti-fuse layer.)

Two additional layers are then formed: a lightly-doped silicon layer 121 doped with a conductivity type dopant opposite to that used for the silicon layer 115, and a heavily-doped silicon layer 122 doped also opposite to the layer 115. After masking and etching, the layers 114, 115, 120, 121, 122 are configured as parallel strips, self-aligned with the edges of the conductive layer 114.

The spaces between adjacent strips are then filed with a dielectric such as silicon dioxide, and then planarized by CMP. In another embodiment, spin-on-glass (SOG) is used to fill the voids between adjacent strips. In this case, chemical planarization can be used, such as plasma etching, for example. Other fill and planarization methods can be used.

Next, another conductive layer 123 is deposited, followed by a heavily doped silicon layer 124 doped with the same conductivity type dopant as layers 121 and 122. Next another anti-fuse layer 125 is formed, for instance from a dielectric such as silicon dioxide. The anti-fuse layer 125 is then covered with a silicon layer 126 doped with a conductivity-type dopant opposite that of layer 124. This is a lightly-doped layer. Another silicon layer 127 is formed on layer 126, and this layer is doped with the same conductivity type dopant as layer 126; however, layer 127 is more heavily doped than is layer 126. After patterning steps, another conductive layer 128 is formed above the layer 127. In this example, the layers 115–122 form a pillar between the crossed conductors 114, 123, and the layers 124–127 form a pillar between the crossed conductors 123, 128.

Masking and etching steps as described below in conjunction with FIGS. 10(a)–10(f) can be used. The memory cell of FIG. 4 is well suited for used with a relatively high write voltage such as 5–20 volts. When this relatively high voltage causes a breach in the anti-fuse layer 120 or 125, a diode is created between the adjacent diode components 115, 121; 124, 126. Without this high voltage, the anti-fuse layer 120, 125 remains an insulator. Thus, by selecting a pair of conductors, diodes can be selectively formed to program the memory array. It is currently preferred that the write voltage be applied with a polarity such that the more positive voltage is applied to the conductor adjacent the anode of the diode that is created once the anti-fuse layer is breached. It is also possible to program using a reverse-bias potential.

To sense the data programmed into the array, a voltage lower than the write voltage is used. This voltage is applied to forward bias the cell being read, thus allowing a sense amplifier to determine whether or not the anti-fuse layer of the respective cell is intact.

It should be noted that n+ layers sandwich the conductor layer 128 and are deposited on the upper side of the conductive layer 114. These highly-doped layers prevent ohmic transitions to prevent unintended Schottky diode formation. Only a single lightly-doped layer (in conjunction with a heavily doped layer) is needed to define a diode; the thickness of this lightly-doped layer is important in controlling the breakdown voltage and resistance of the diode so formed.

It should be noted that the p and n-type layers immediately below each of the conducting layers 123, 128 are heavily doped. It is these heavily-doped layers that are planarized, which simplifies fabrication.

Table 1 provides preferred materials for the example of FIG. 4. Polysilicon semiconductor material can be used for the semiconductor layers and can be deposited with a CVD process, where a dopant such as phosphorus is deposited along with silicon. Alternatively, the dopant may be ion implanted following deposition of the layer.

TABLE 1

Preferred Materials (FIG. 4)

| Ref. No. | Material | Thickness (Å) | Dopant | Dopant Concentration (atoms/cm$^{-3}$) |
|---|---|---|---|---|
| 115, 125 | SiO$_2$ | 50–1000 | | |
| 126 | Si | 1000–4000 | Phosphorous | $1 \times 10^{17}$ ($1 \times 10^{15}$–$1 \times 10^{19}$) |
| 115 | Si | 300–3000 | Phosphorous | $>10^{19}$ |
| 114, 123, 128 | Ti—TiN | 500–1500 | | |
| 127 | Si | 1500–2000 | Phosphorous | $>10^{19}$ |

Throughout this specification, two adjacent semiconductor layers are often shown with different levels of doping (e.g., layers 126, 127 or layers 121, 122). Such pairs of adjacent layers may be formed with one deposition, using ion implantation steps at two different energy levels to obtain the two doping levels. Also, these differently-doped layers may be formed by introducing different amounts of dopant in a diffusion process as a layer is formed.

The conductive layers 114, 123, 128 may be formed using any of numerous well-known thin-film deposition processes such as sputtering. A refractory metal may be used, or a silicide of a refractory metal may be used. Other alternatives include aluminum, copper, or heavily doped silicon. In one embodiment, titanium and titanium nitride layers are formed, and the wafer is heated to form a silicide. For example, a titanium layer of 250 Å thickness and a titanium nitride layer of 70 Å thickness can be heated at 600° C. for one minute to form the silicide. After planarization, the layer 127 preferably has a thickness between 300 and 2,000 Å.

FIG. 5 shows another possible arrangement, which uses similar layers to those of FIG. 4 arranged in a different order. FIG. 6 shows another alternative, in which all p-type semiconductor layers have been eliminated. In this embodiment the conductive layer 123 is sandwiched between two n+ layers, and more lightly doped n− layers are disposed on these more heavily doped n+ layers. An anti-fuse layer is disposed between the n− layer and the adjacent conductive layer 114, 128.

Programming the array of FIG. 6 causes the formation of Schottky diodes. For this reason, the conductors such as conductive layers 114, 123, 128 should be made of a suitable material to allow formation of a Schottky diode. For instance, aluminum and some refractory metal or silicides may be used.

Some of the embodiments discussed above use both p-n+ and p+n− diode types. In some processes, one of these diode types may exhibit more leakage than the other. Consequently, it may be desirable to have, for these processes, an array with only a single diode type. More specifically, assume a process has higher leakage for diodes of the p-n+ type than the same process has for diodes of the p+n− type. FIG. 7 illustrates an array embodiment where, if the anti-fuse layer is breached, all the diodes will be p+n− type, that is, there will be no diodes with a p−n+ junction. Table 2 provides preferred thicknesses for the layers 130–138 of FIG. 7.

TABLE 2

Preferred Thickness (FIG. 7)

| Ref. No. | Thickness (Å) |
|---|---|
| 114, 123 | 500 |
| 130, 138 | 1000 |

TABLE 2-continued

Preferred Thickness (FIG. 7)

| Ref. No. | Thickness (Å) |
|---|---|
| 131, 136 | 30 |
| 132, 135 | 2000 |
| 133, 134 | 500 |

As discussed above, the semiconductor layers may be formed using polysilicon or an amorphous silicon. The conductors may be a highly doped silicon or a metal, metal alloy, silicide or combinations thereof. The dielectric fill in the spaces between the pillars is also used, as discussed for the earlier embodiments.

As can be seen from FIG. 7, if the anti-fuse layer 131 is breached, the diodes between the conductors 114 and 123 are all p+n− type, and similarly, the diodes in the next level between the conductors 123 and 128 are again all p+n− type. The pillars shown in FIG. 7 are used throughout the memory array, so that the entire array has only p+n− type diodes in its memory cells.

The diodes in the illustrated pillars of FIG. 7 are forward biased towards the conductor 123 and the conductor 141. If need be for a particular application, the diodes can be oriented identically, that is, with all their anodes (or cathodes) pointing upwardly. This can be obtained for the p+n− type diodes by having both a p+ doped and n− doped semiconductor layer in each of the pillars. For instance, layer 134 and 135 would be replaced with a p+ layer and layer 138 would be replaced with n− and n+ layers. This still maintains only one type of diode (p+n−) throughout the array.

While FIG. 7 shows that after the anti-fuse layer is breached, only p+n diodes will be created, an array with only p−n+ type diodes can be fabricated by replacing the p+ layers with an n+ layer and replacing the n+ and n− layers with p+ and p− layers. Also, the array can have the anodes (or cathodes) vertically aligned as discussed above for the p+n− type diodes.

Another memory array embodiment, which uses only a single type of diode junction, is shown in FIG. 8. This embodiment employs conductors 150, 152, 154, each formed of a respective, uniformly doped semiconductor material. As shown in the example of FIG. 8, the conductors 150, 154 are formed of p-type semiconductor material, such as a doped layer of polysilicon. The conductor 152 is formed of an n-type semiconductor material, which again can be formed of doped polysilicon. In this example, each pillar is made up of only a single respective anti-fuse layer 156, 158, 160. Each of the conductors 150, 152, 154 is both a conductor and a diode component for the respective memory cells. For example, when the anti-fuse layer 156 is disrupted, the conductor/diode components 150, 152 come into contact with one another and form a PN diode. The advantage of the embodiment of FIG. 8 is easy fabrication.

Typically, the semiconductor strips 150, 152, 154 are less conductive than the metal conductors previously discussed. This, for instance, will increase the access time of the cells, particularly in a large array. The conductivity of the strips 150, 152, 154 can be improved by increasing the concentration of the p-type and n-type dopants. However, when this is done, the leakage current increases. For any given array, decreased resistance can be traded-off for increased leakage and vice-versa. It is contemplated that this embodiment will be especially useful for a relatively small array where high-speed access is not critical.

As can be seen from FIG. 8, after the anti-fuse is breached, the diodes associated with each of the cells are the same; specifically the p- and n-type dopant concentrations for each diode are the same.

In the above description two levels share a conductor. An array may be fabricated where there are two conductors for each level that are not shared with other levels. A dielectric may be used to separate each such level. Also while above diodes on alternate levels "point" in the same direction for some embodiments, this is not necessary. For instance, a shared conductor may have diodes point-in from above and point-out from below. This requires different driving circuitry in the substrate.

The example of FIG. 9 is similar to that of FIG. 7. All silicon layers are deposited as amorphous or microcrystalline layers, and the silicon is preferably recrystallized during an annealing step at 800° C. that is performed after all layers are deposited. The titanium disilicide layers are preferably formed as described in U.S. patent application Ser. No. 09/928,975, assigned to the assignee of the present invention and hereby incorporated by reference in its entirety. As described in this application, a layer of undoped amorphous silicon is formed under a layer of Ti, and the thickness of the amorphous silicon is 2.4 times greater than that of the Ti. Two successive annealing operations (the first at 600° C. for 60 seconds and the second at 800° C. 60 seconds) convert these two layers to low-resitivity titanium dioxide. Table 3 provides preferred layer parameters.

TABLE 3

Preferred Materials (FIG. 9)

| Reference No. | Material | Thickness (Å) | Dopant | Dopant Concentration (atoms/cm$^{-3}$) |
|---|---|---|---|---|
| 114, 123, 128 | TiSi$_2$ | 500 | | |
| 172, 177 | SiO$_2$ | 25 | | |
| 174, 175 | Poly Si | 500 | Phosphorous | >1 × 10$^{20}$ |
| 173, 176 | Poly Si | 2000 | Phosphorous | 1 × 10$^{17}$ |
| 178 | Poly Si | 1500 | Boron | >1 × 10$^{20}$ |
| 170 | Poly Si | 2000 | Boron | >3 × 10$^{20}$ |

All the above embodiments have benefits over the prior-art three-dimensional memories. One advantage is that the diodes are formed by breaching an anti-fuse layer. This results in diodes with very small junction areas. The resultant low-leakage diodes improve the performance of the array. The different embodiments provide numerous material choices and diode component choices.

Fabrication Sequence

Figure 10A:
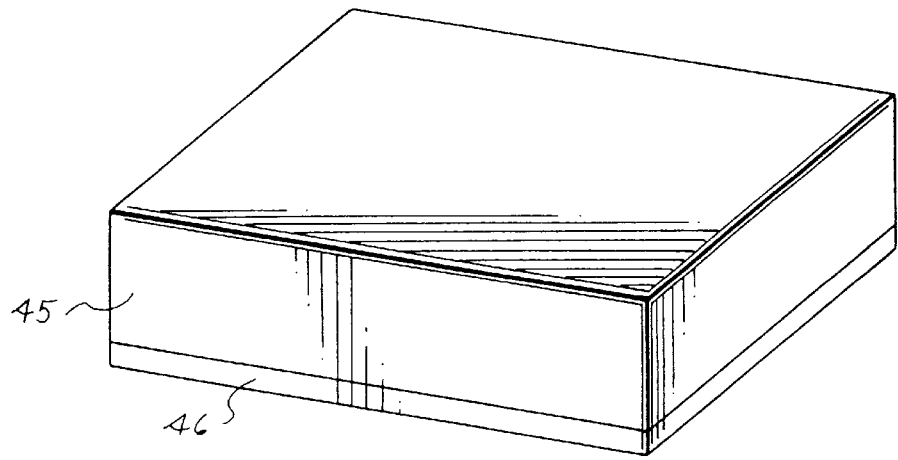
FIG. 10($a$) is a perspective view of a conductor layer and layer stack used in the fabrication of the cell of FIG. 1.
Figure 10B:
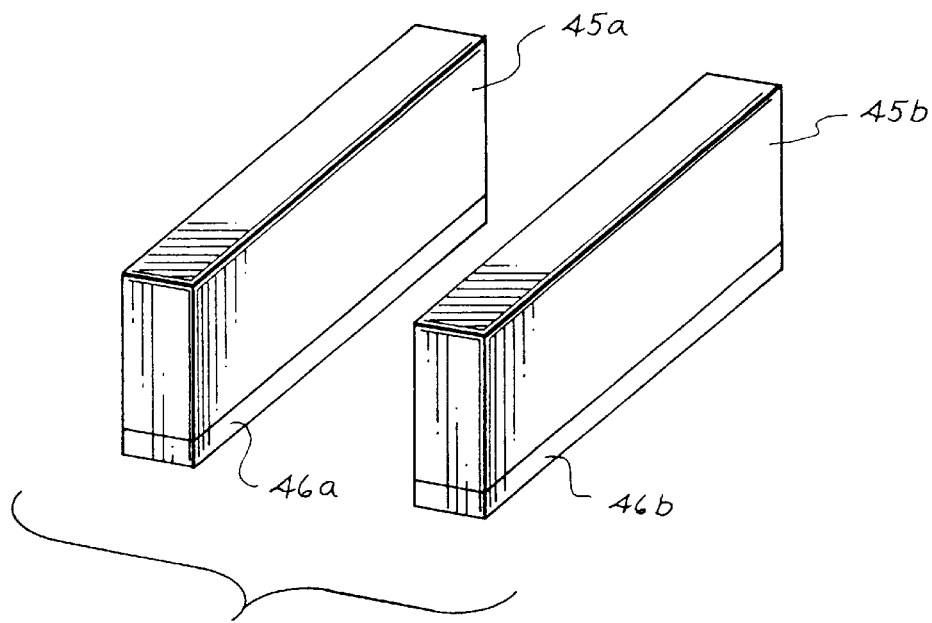
Figure 10C:
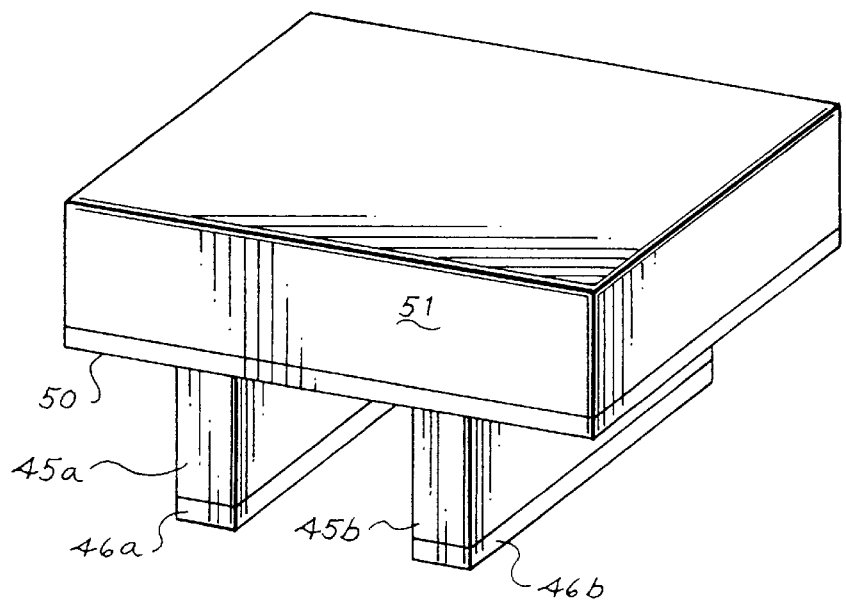
Figure 10D:
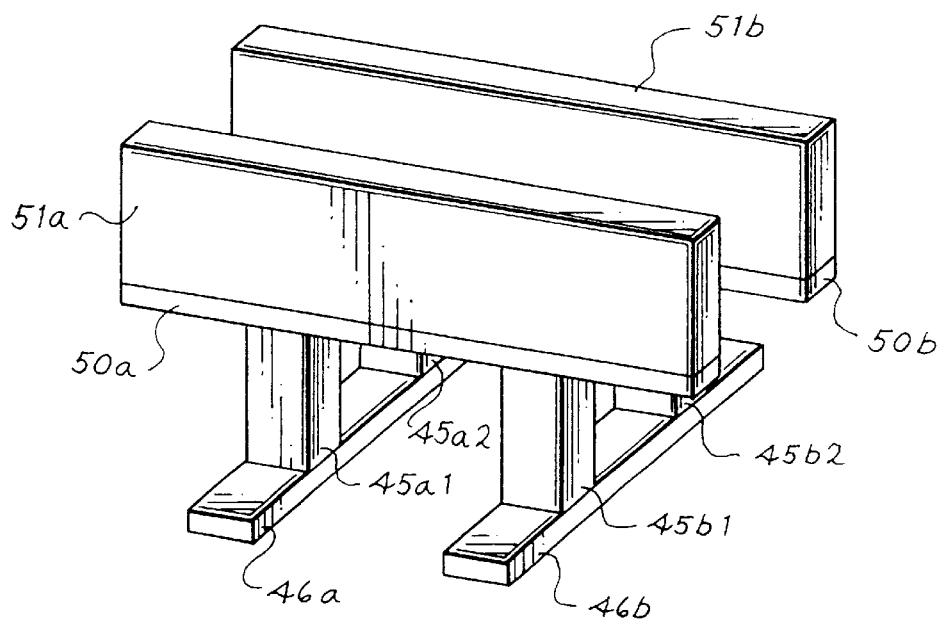
Figure 10E:
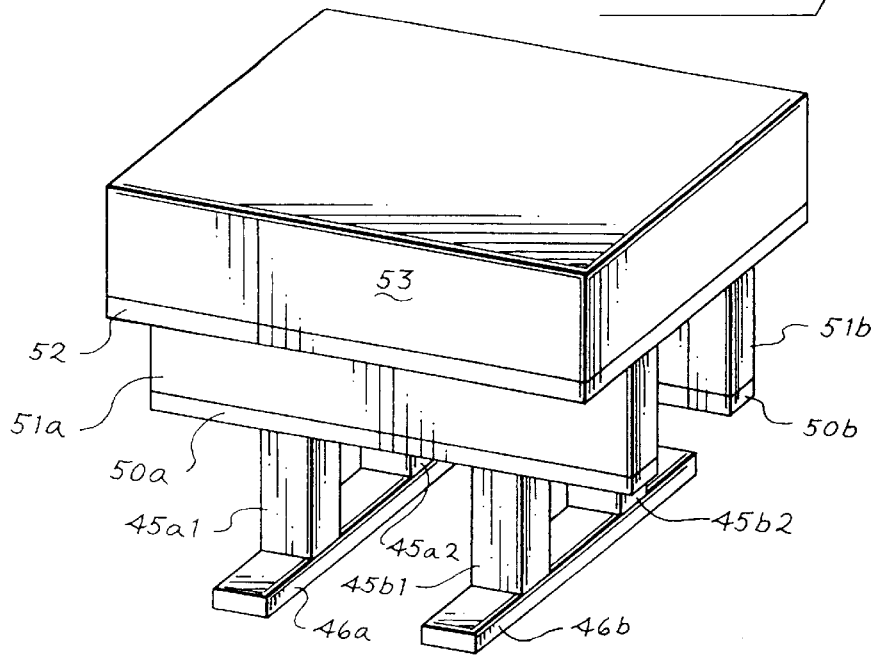
Figure 10F:
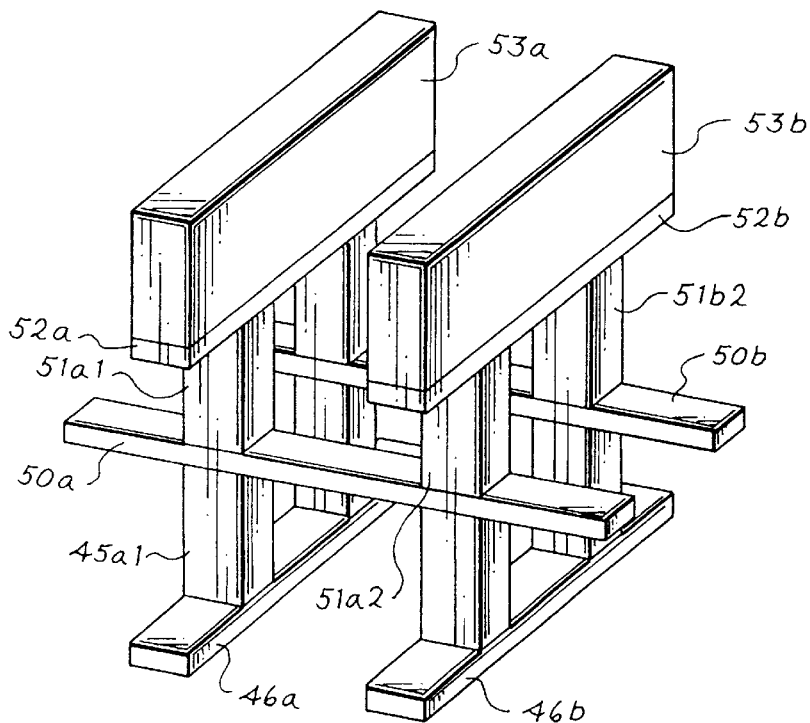

A preferred fabrication sequence for the memory cell is schematically illustrated in FIGS. 10(a)–10(f). After deposition and before patterning, the conducting layer 46 and layer stack 45 are continuous sheets that extend across the entire integrated circuit (indeed across the entire wafer) such as shown in FIG. 10(a). The layer stack 45 can include any of the sets of layers that make up a pillar in the examples of FIGS. 4–9. Conceptually the self-alignment method is a two-etch-step procedure: In the first etch step, this layer stack (a continuous sheet) is patterned into long straight strips running (say) east-to-west, by etching them with the same patterning step that etches the east-to-west conductors on the conductor layer below. After deposition and planarization of an interlevel dielectric, a second conductor and layer stack are deposited. This stack is patterned into long straight strips running north south. Etching used to pattern the north-to-south conductors continues until the first layer stack has also been etched through. This results in pillars formed on the east-to-west running lines. The resulting pillars are perfectly aligned to both the conductor below and the conductor above since both the pillars and the conductors are etched simultaneously. In alternate embodiments the semiconductor layers within the layer stack 45 may be deposited as microcrystalline or polycrystalline, and then laser treated to improve crystallinity and enhance the dopant activation.

The cross-section of the pillar will be rectangular with one dimension being equal to the width of the bottom conductors and the other dimension equal to the width of the top conductors. If these conductors have equal width then the cross-section will be square.

The patterning in both east-to-west and north-to-south uses well-known photolithographic steps widely used in the semiconductor industry and may use either wet or dry etching. Also, the silicon used in the cells and in some cases for the conductors may be doped insitu or after being deposited, for example, by ion implantation.

Of course other patterning technologies may be used rather than etching, for example "liftoff" technology or "Damascene" technology or an additive rather than subtractive patterning technology may be employed instead of etching. But ideally the layer stack should be patterned in two separate steps, once with the mask that defines the conductors below, and again with the mask that defines the conductors above. This holds true regardless of the specific fabrication techniques used to pattern the various layers.

In practice a large number of vertically stacked memory cells are built, and each conductor layer is self-aligned to both the layer stack below and the layer stack above. Therefore the etching steps which self-align the conductors to the pillars, must etch away material from three different layers: the layer stack above, the conductor layer, and the layer stack below.

The processing may begin with a wafer that may have received prior processing steps, for example, CMOS transistors may be fabricated in the substrate for the peripheral circuitry. An insulator then is deposited, and preferably, planarized (using chemical-mechanical polishing ("CMP"), resist etchback planarization, or any of a number of other technologies for planarization). The first conductor layer is deposited such as layer 46 of FIG. 10(*a*), and then the first layer stack 45 is deposited. FIG. 10(*a*) shows the wafer at this stage.

Next, the mask that defines the features on the conductors1 layer is applied, and these features are etched into both the pillar layer stack 45 and the conductors1 layer 46 below. An insulator is deposited on the wafer and planarized, using CMP or other planarizing technology. FIG. 10(*b*) shows the wafer at this stage. Note in particular that the pillar layer stack and bottom layer have been etched into long continuous strips (46*a* and 45*a*) and (46*b* and 45*b*), not isolated individual pillars. Also note that the edges of the pillar layer stack 45*a* and 45*b* are aligned to the edges of the conductor 46*a* and 46*b* layer, since both were etched at the same time with the same mask. Note the conductors generally comprise coplanar conductors, such as aluminum or other metals, silicides, or doped silicon conductors, for each level.

While not shown in FIG. 10(*b*) or the other figures, dielectric fills the voids between the strips (and pillars) and thus adds support to the array. Also it should be noted that the planarization reveals the upper surface of the strips so that the conductor layer that follows contacts the strips. The planarized dielectric also forms the layers through which vias and vertical conductors pass.

Next, the second conductor layer 50 ("conductors2") is deposited, and the second layer stack 51 ("stack2") is deposited. FIG. 10(*c*) shows the wafer at this stage. Note that the planarization automatically gives a self-aligned contact between a layer stack (such as 45*b*) and the subsequent conductor layer (such as 50) above it.

Now, the conductors2 mask is applied, and its features are etched downward into three distinct strata: layer stack2 (51), conductors2 layer 50, and layer stack1 (45*a* and 45*b*). (This etch stops below the diode components within 45*a* and 45*b*, providing a unique circuit path through the memory cell). An insulator is deposited on the wafer and planarized (using CMP or other means). FIG. 10(*d*) shows the wafer at this stage. Note that the conductors2 mask+etch has completed the definition of the individual pillars (45*a*1, 45*a*2, 45*b*1 and 45*b*2) in the layerstack1. Also note that these pillars in the layerstack1 layer are aligned to both the conductors1 layer (46*a*, 46*b*) and to the conductors2 layer (50*a*, 50*b*), thereby achieving the goal of self-alignment.

Next, the third conductor layer 52 ("conductors3") is deposited, and the third layer stack 53 ("layerstack3") is deposited. FIG. 10(*e*) shows the wafer at this stage.

Now, the conductors3 mask is applied, and its features are etched downwards into layerstack3, conductors3, and stack2. (This etch stops below the diode components of layer stack 2 and is intended to leave the conductors layer intact.) An insulator is deposited on the wafer and planarized (using CMP or other means). FIG. 10(*f*) shows the wafer at this stage. The conductors3 mask+etch has completed the definition of the individual pillars in the layerstack2 layer (such as 51*a*1, 51*a*2, 51*b*2). FIG. 10(*f*) shows that (N+1)=3 conductor layers and hence (N+1)=3 masking steps, are required to pattern (N=2) layers of pillar layerstack (not counting the interlevel via layers which are used in the peripheral circuits but not in the memory array). The wafer is now ready to receive more stack layers and conductor layers, at the discretion of the manufacturer.

In one possible embodiment of an array of the invented memory cells the pillars are vertically stacked directly above one another as illustrated in FIG. 10(*f*). Note that pillars are lined up in vertically aligned stacks. However, because of self-alignment, this vertical stacking of pillars directly above one another is not a requirement.

Memory cell pillars are automatically formed wherever a conductor on conductor layer (J+1) crosses over a conductor on conductor layer (J). This is true even if the conductor layers are not lined up directly above one another, giving vertical stacks of pillars. In fact it may be preferred that the pillars not be stacked vertically; that is they are offset from one another, as illustrated in FIG. 11. Compare FIG. 3 (vertical stacks of pillars) to FIG. 11 (pillars offset from one another) to see the effect. Offset or staggered pillar placement such as shown in FIG. 11, may be advantageous in practice. It may help give a smoother wafer surface, more suited to planarization and polishing.

In the foregoing sequence of steps, electrode or conductor material is etched along with device material. Since most plasma metal etches also etch polysilicon, a practical combination of materials that enables such dual etching would be aluminum and polysilicon, for example. Control of the etching process may be effected, if desired, through the use of etch chemistries that are selective (e.g., preferentially etching polysilicon, but stopping on aluminum), or through the use of barrier materials that are not etched by the etchants that remove electrode and device material. The anti-fuse layer may also be used as an etch stop, particularly if it is an oxide rupture type.

Refractory metals such as molybdenum and tungsten are compatible with conventional CVD deposition temperatures for Si and may be used for the conductors. Metal silicides are compatible with even higher temperatures used to activate dopants in Si. Even heavily doped Si itself can be used as a conductor. The choice may be dictated based on resistivity and integration concerns including etch characteristics.

The planarization described after the first half-step of the foregoing allows the formation of self-aligned contacts to the half-etched cells (i.e., the lines running in the east-west direction in the foregoing example). Such planarization may be effected through a variety of means well known in the art, such as chemical-mechanical polishing (CMP), etched-back spin-on dielectric layers, and etched-back spin-on polymers, to cite three well-known examples. To tolerate the possibility of excessive over-polishing or over-etching that may occur during planarization, a second planarization may be performed after deposition of an electrode layer to insure a planar electrode surface for subsequent deposition of device material layers.

The foregoing process sequence exploits self-alignment to reduce the required alignment tolerances between the pillar and the conductors. This embodiment may be substituted with an embodiment involving one or more additional photomasking steps to explicitly define the pillar itself, rather than defining it using the intersection of two conductor photomasking steps, as is done in the self-aligned process. This may be advantageous in various processes that exploit the explicitly defined sidewalls that result from such a process. For example, solid-phase crystallization of amorphous silicon can be used to form the diode component layer stack. The free energies of the sidewalls are expected to favor the formation of a single crystal or grain within the diode component, which may be advantageous in some embodiments.

Another process that can exploit explicitly defined sidewalls is laser-induced crystallization. Again, the free energies of the sidewalls are expected to favor the formation of a single crystal or grain within the diode components.

In processes involving the explicit definition of the pillar, a photomasking step can be used to define a bottom conductor which is then etched. Then, the layer stack required to form the anti-fuse and optionally the diode components is deposited. Another photomasking step is used to define the pillar, which is then etched. After this etch, an insulating material is deposited and planarized as in the self-aligned cell, exposing the top of the pillar to form a self-aligned contact. The top conductor is then deposited, and the process is repeated for subsequent levels of cells as required.

The order of masking steps in the above process can also be reversed. For example, the pillar can be formed prior to patterning the bottom conductor. In this process, the entire layer stack for the bottom conductor, the diode components, and the anti-fuse layer is deposited. The pillar is then lithographically defined and etched. The bottom conductor is then defined and etched. This structure is passivated using a planarized insulator-contacting scheme, as described above. In all three processes, the self-aligned contact can also be replaced by an explicit contact-forming photomasking step.

The various device fabrication steps may result in the presence of residual chemicals or dangling bonds that may degrade device characteristics. In particular, device leakage can result from the presence of such dangling bonds or chemicals (e.g., incompletely removed photoresist). A low-temperature (e.g., <400C) plasma oxidation exposure may be used to grow a clean-up oxide on the edges of the device pillar, thereby passivating edge traps. The growth of the oxide is self-limiting because the oxygen species diffuse only slowly through previously grown oxide, resulting in extremely uniform oxide thickness and, therefore, improved manufacturability. (Plasma oxidation may also be used to form an anti-fuse layer.) Oxide deposition may also be used to passivate the surface, for example, either alone or in conjunction with a grown oxide.

Because, in the foregoing for some embodiments, device material (e.g., polysilicon) is deposited after electrode material (e.g., metals), it is desirable to deposit and process the device material at the lowest practical temperatures to widen the selection of suitable metals. As an example, in-situ doped polysilicon may be deposited at low temperatures using LPCVD (low (pressure chemical vapor deposition), PECVD (plasma-enhanced chemical vapor deposition), PVD (physical vapor deposition), or UHVCVD (ultra high vacuum chemical vapor deposition). An alternative is to deposit undoped polysilicon, followed by doping and activation using a low temperature process. (Traditional activation steps such as long thermal anneals expose the wafer to potentially undesirably high temperatures.) It may also be desirable in some cases to substitute microcrystalline or amorphous silicon or crystallized amorphous silicon for the polysilicon to enable low temperature fabrication.

Another concern is the possibility of diffusion of electrode material (e.g., metal) into the device layer during processing. Low-temperature processing helps to reduce the severity of this problem, but may be insufficient to solve it completely. To prevent this problem, a number of barrier materials may be employed. Examples include titanium nitride (TiN), tantalum (Ta) or tantalum nitride (TaN), among many that are well known to the art.

In one embodiment of the cell, a thin dielectric layer is employed as an anti-fuse element. In such a cell, good uniformity of dielectric thickness, as well as a low film defect density (e.g., of pinholes in the dielectric) are among highly desirable properties. The quality of the dielectric may be enhanced through a variety of means, such as rotating (continuously or periodically) the substrate and/or source during deposition; forming the dielectric by thermal means using plasmas or low-temperature growth chemistries; or by employing liquid-phase dielectric deposition means.

It is desirable to reduce the number of masking steps that involve critical alignment tolerances. One method for reducing the number of masking steps is to employ vias that interconnect several electrode layers. The vias may be rectangular, rather than square, to allow a relaxation in alignment tolerances. For example, to interconnect metal lines in several layers running in the x-direction, the x-edge via size may be made substantially looser than the pitch of the x-lines in the y-direction, resulting in a rectangular via.

Memory Cell: Small Feature Sizes

As was previously discussed, self-alignment permits the pattern features of the memory cell to be small, since it is not necessary to allow for misalignment tolerances when laying out the features. These smaller features allow reduction in the memory cell area, in fact smaller than it otherwise could be without self-alignment. There is also a second benefit of the memory cell area that permits additional reduction of the cell size: the highly repetitive pattern of geometric features on each mask layer.

The geometric shapes in each layer of the memory cell arrays described above are especially simple: they are merely a highly repetitive, regular set of closely spaced, long, straight parallel conductor lines. Their simplicity and regularity can be exploited in photolithography, allowing better resolution of smaller feature sizes than otherwise would be possible with arbitrary-shaped geometries. For example, if a (wafer stepper and illumination source and lens and photoresist) system were normally rated for X micron resolution (e.g. 0.18 microns), the simple and highly regular shapes of the present invention would permit lines and spaces substantially smaller than X microns. The present invention can take advantage of the fact that there are no arbitrary-shaped geometries; rather there is a highly repetitive, very simple pattern, which is well known in the field of optics and is called a "diffraction grating" in textbooks. It will be readily apparent to those skilled in the art how to exploit the advantages of a diffraction grating pattern to achieve better resolution.

3 Dimensional Array Organizations

For a moment assume an embodiment that has six layers of memory cell pillars, and that therefore has seven conductor layers of conductors. If the bottom conductor layer (conductors1) runs east-to-west, then conductors3, conductors5, and conductors7 also run east-to-west. Conductors2, conductors4, and conductors6 run north-to-south. For simplicity consider an embodiment in which the pillars are not offset or staggered; rather, they are stacked directly above one another. A single vertical stack of six such pillars is shown in FIG. 12.

Figure 12:
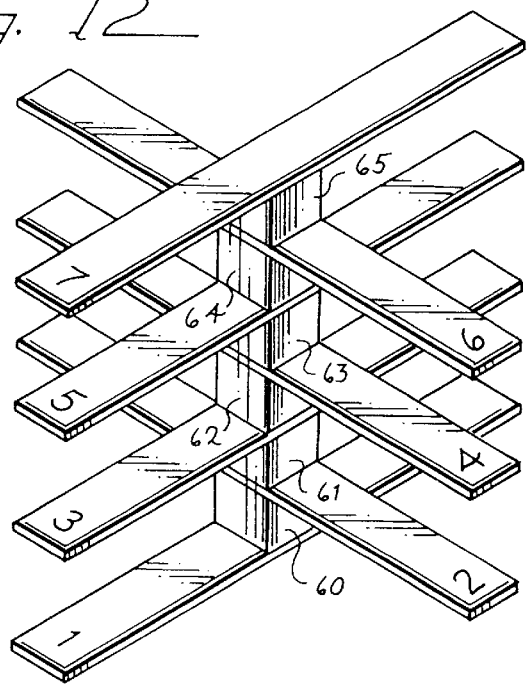
FIG. 12 is a perspective view of vertically stacked cells.
Figure 13:
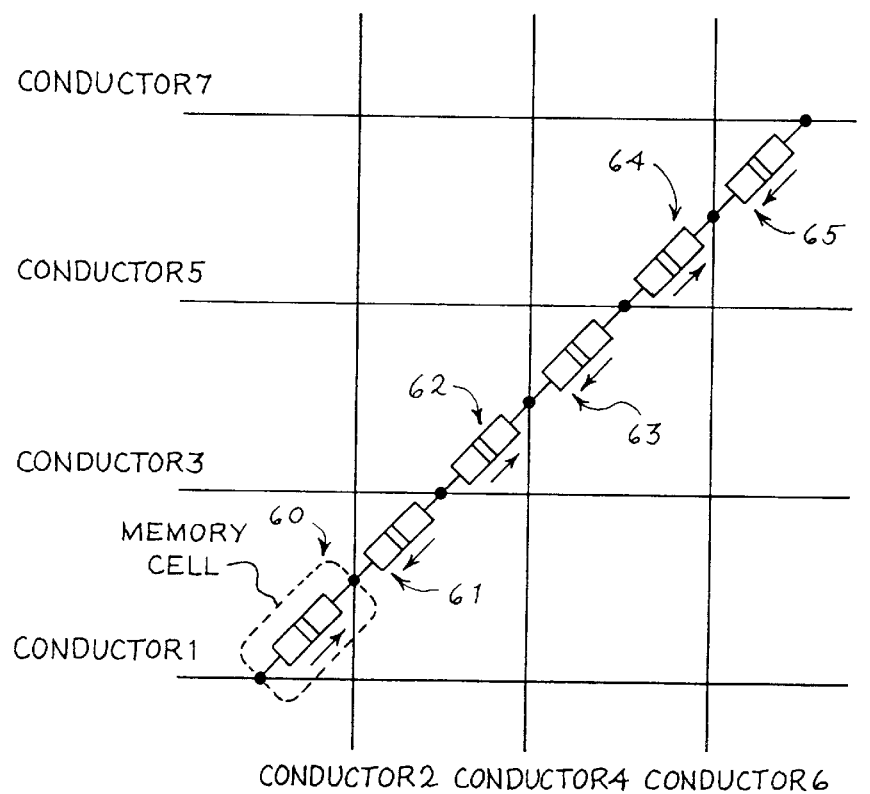
FIG. 13 is a schematic of the cells of FIG. 12.

The stack of six memory cell pillars (60–65) of FIG. 12 is shown as a circuit schematic diagram in FIG. 13. Notice that conductor layers 1,3,5,7 are spaced apart from one another in the schematic diagram, but in the physical structure (FIG. 12) they are vertically stacked directly above one another. Similarly, conductor layers 2,4,6 are vertically stacked in FIG. 12 but spaced apart in FIG. 13.

There are six memory cell pillars in FIG. 12: one where conductors2 crosses conductors1, one where conductors3 crosses conductors2 . . ., and one where conductors7 crosses conductors6. In the schematic of FIG. 13 these are shown along a diagonal. At the bottom left, a memory cell (containing diode components and an anti-fuse layer) is shown between conductors2 and conductors1. FIG. 13 also shows a memory cell where conductors3 crosses conductors2, another cell where conductors4 crosses conductors3, etc.

Adjacent layers of memory cell pillars share a conductor layer; thus they also share an I/O terminal. In one embodiment, sharing only occurs between terminals of like type: input terminals share a conductor layer with other input terminals, and output terminals share a conductor layer with other output terminals. This embodiment is advantageous, because it means each conductor layer is unambiguously either an input layer or an output layer. There is no mixing as would occur if a conductor layer were shared among input terminals and output terminals, and the peripheral circuitry is simplified. Input-terminal-driver circuits and output-terminal-receiver circuits need not be collocated and multiplexed onto the same conductor.

A result of the like-terminals-shared preference is that the diode components in the memory cells will be oriented alternately cathode-up, then cathode-down, then cathode-up, etc. To see this, suppose conductor layer conductors2 is an output layer; then the cathodes of pillar and pillar 61 both connect to conductors2. Thus pillar must be oriented cathode-up and pillar 61 is cathode-down. Continuing, if conductors2 is an output layer, then conductors3 is an input layer. The anodes of pillar 61 and pillar connect to conductors3. So pillar is cathode-up. The layers of pillars must alternate, cathode-up, cathode-down, up, down, up, and so forth (see FIG. 13) for this embodiment. This means that during fabrication, the sublayers of the pillar sandwich will be deposited in a different order. In some pillar layers the anode material sublayer will be deposited before the cathode material sublayer, and in the other pillar layers the cathode material sublayer will be deposited first. Thus the layers shown in FIGS. 4–9 will be in the order shown in alternate array levels and in the opposite order in the remaining levels. However, it should be recalled that it is not necessary to alternate the stack material for some embodiments.

A further result of the preference for sharing like terminals of memory cells is that it makes the conductor layers alternate between input terminals only and output terminals only. Since successive conductor layers run east-to-west, then north-to-south, then east-to-west, etc., this means that all input conductors will run the same direction (e.g. east-to-west), and all output conductors will run the same direction (e.g. north-to-south). So it will be especially easy to locate the input-terminal-driver circuits together (e.g. along the west edge of the memory array), and to locate the output-terminal-receiver circuits elsewhere (e.g. along the south edge of the memory array).

This corresponds to standard practice in conventional memory design: the input-terminal-driver circuitry 67 is located along the west edge of the array, and the output-terminal-receiver circuitry 68 is located along the south edge of the array, as shown in FIG. 14. Sometimes conventional memories put half the input-terminal-driver circuits along the east edge and half along the west edge; this is often done when the memory cell row pitch is very tight. Similarly, conventional memories sometimes place half the output-terminal-receiver circuits along the south edge and half along the north edge; this is done when the memory cell column pitch is very tight. FIG. 15 shows a conventional memory with this splitting performed.

It is now appropriate to note that the input-terminal-driver circuitry in a non-volatile memory (both conventional prior art, and the present invention) has a shorter and less cumbersome name: "row address decoder" circuitry. And the output-terminal-receiver circuitry in a non-volatile memory (both conventional prior art, and the present invention) has a shorter and less cumbersome name: "column address decoder and column I/O" circuitry. In this section of the disclosure, which discusses array organization outside the memory cell mats, this shorter name will be used.

Figure 16:
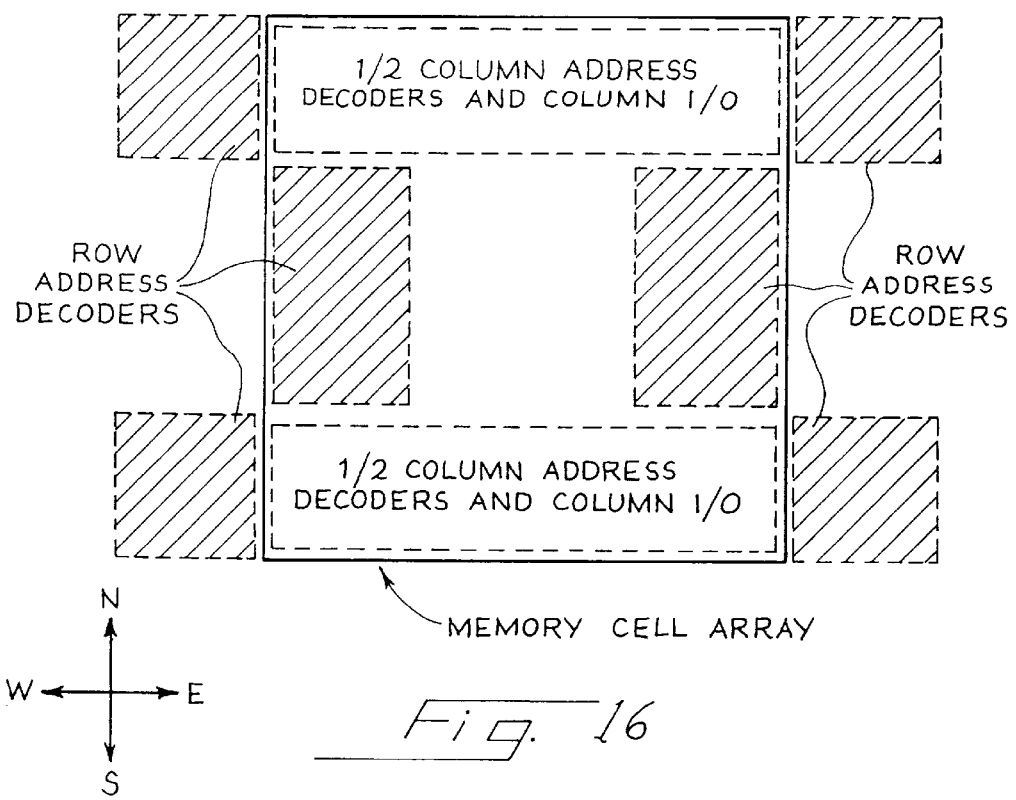
FIG. 16 is a plan view of a substrate showing one layout of circuitry in a substrate used for the present invention.
Figure 17:
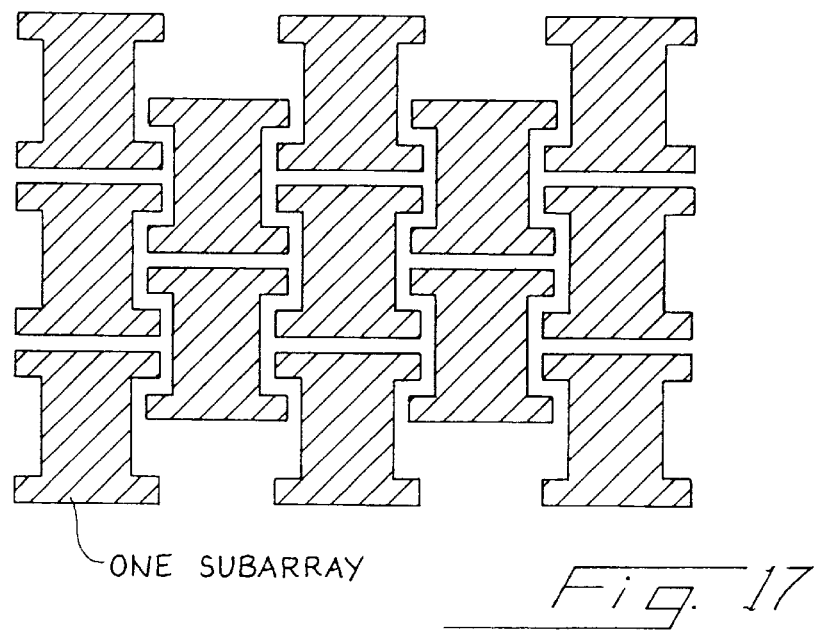
FIG. 17 is a plan view of circuitry for an embodiment of the present invention using a plurality of subarrays.

It is possible to fold the row decoder circuits and the column decoder and column I/O circuits underneath the memory array. (This is possible because the memory array is above the underlying substrate and does not contact the substrate.) Completely folding all of the row decoder circuits and all of the column circuits underneath the array is not done; such folding would overlap in the corners. In one embodiment, the column decoder and column I/O circuits are folded beneath the memory array, but the row address decoder circuits remain outside the array. In another embodiment, the column circuits are underneath the array, and the central portion of the row decoders is folded (where there is no conflict with the column circuits) under the array. This gives a layout with small "tabs" of row circuits at the corners, as shown in FIG. 16. These tabs can be interdigitated with the tabs of other memory arrays, letting four (or more) arrays nestle closely together, as shown in FIG. 17. Other variations on the theme of partially folding decoders under the array will be readily apparent to those skilled in the art.

As the previous paragraph alludes, the field-programmable, non-volatile memory of the present invention includes the organization of the memory chip into several smaller subarrays, rather than one single large array. Subarrays give three important benefits: (1) they allow a simple block-level approach to redundancy; (2) they increase operating speed; (3) they lower operating power. Redundancy with subarrays can be quite straightforward. If the end product is to be a memory having (say) 8N bits, it is a simple matter to build nine subarrays on the die, each containing N bits. Then one of the nine subarrays can be defective, yet the die can still be configured and sold as a working 8N bit memory, by simply bypassing the defective subarray.

Dividing the memory into subarrays also increases speed; this is because the conductors are shorter (decreasing their resistance), and there are fewer memory cells attached to each conductor (decreasing the capacitance). Since delay is proportional to the product of resistance and capacitance, cutting conductor length in half cuts delay by a factor of four. Thus subarrays decrease delay, i.e. increase speed.

Subarrays also provide lower power operation. Since one important component of power is the capacitive charging and discharging of conductors in the memory array, decreasing the conductor capacitance will decrease power consumption. Cutting conductor length in half cuts capacitance in half, which cuts the capacitive charging and discharging current in half.

Johnson U.S. Pat. No. 6,034,882 should be referenced for a further discussion of contact formation, row decoding and selection, column decoding and selection, precharging the memory array, and read/write peripheral circuits.

As used here, the term "set" is intended to mean one or more. Thus, a set of layers in a pillar can include a single layer as shown in FIG. 8, or two or more layers as shown in FIGS. 4, 5, 6, 7 and 9.

The foregoing detailed description has discussed only a few of the many forms that this invention can take. This detailed description is therefore intended by way of illustration, and not by way of limitation. It is only the following claims, including all equivalents, which are intended to define the scope of this invention.

What is claimed is:

1. A process for fabricating a memory array comprising:
   (a) forming a first layer of conductive material;
   (b) forming a set of second layers for defining memory elements on the first layer;
   (c) patterning the set of second layers into a plurality of parallel, spaced-apart strips;
   (d) etching the first layer in alignment with the strips formed from the set of second layers;
   (e) forming a third layer of conductive material on the strips formed from the set of second layers;
   (f) forming a set of fourth layers for defining memory elements of the second level;
   (g) patterning the set of fourth layers into a plurality of parallel, spaced-apart strips, the strips formed from the set of fourth layers running generally perpendicular to the strips formed from the first layer;
   (h) etching the third layer and the strips formed from the set of second layers in alignment with the strips formed from the set of fourth layers;

said set of second layers comprising a first anti-fuse layer, said set of fourth layers comprising a second anti-fuse layer, said anti-fuse layers each positioned between a respective pair of diode components that form a diode only after the respective anti-fuse layer is disrupted.

2. The process defined by claim 1 including:
   forming a fifth layer of conductive material on the strips formed from the set of fourth layers;
   patterning the fifth layer into a plurality of parallel, spaced-apart conductors running generally perpendicular to the strips in the set of fourth layers; and
   etching the strips formed from the set of fourth layers in alignment with the conductors, thereby defining additional memory cells.

3. The process defined by claim 1 repeating (a) through (h).

4. The process defined by claim 3 in combination with the acts of claim 2.

5. The process defined by claim 1 repeating the steps (a) through (h) a plurality of times.

6. The process defined by claim 5 in combination with the acts of claim 2.

7. The process defined by claim 1 including depositing an insulator and etching it back to planarize the structure and opening electrical contacts to the strips formed from the set of second layers between (d) and (e).

8. The process defined by claim 1 wherein the set of second layers and set of fourth layers each comprise layers of polysilicon and silicon dioxide.

9. The process defined by claim 1 wherein the set of second layers and set of fourth layers each comprise layers of polysilicon and silicon oxynitride.

10. The process defined by claim 1 wherein the anti-fuse layers comprise silicon dioxide.

11. The process defined by claim 1 wherein the anti-fuse layers comprise silicon oxynitride.

12. The process defined by claim 1 wherein a planarization step occurs after the forming of the set of second layers and before the forming of the third layer.

13. The process defined by claim 12 wherein the planarization is performed by chemical-mechanical polishing.

14. The process defined by claim 8 wherein the polysilicon is deposited at low temperature using chemical vapor deposition.

15. The process defined by claim 1 including the use of ion implanted silicon.

16. The process defined by claim 1 including the use of in-situ doped silicon.

17. The process defined by claim 16 wherein the silicon is deposited using LPCVD.

18. The process defined by claim 16 wherein the silicon is deposited using PECVD.

19. The process defined by claim 16 wherein the silicon is deposited using PVD.

20. The process defined by claim 16 wherein the silicon is deposited using UHVCVD.

* * * * *